United States Patent
Melliar-Smith et al.

(10) Patent No.: US 8,230,316 B2
(45) Date of Patent: Jul. 24, 2012

(54) FORWARD ERROR CORRECTION FOR BURST AND RANDOM PACKET LOSS FOR REAL-TIME MULTI-MEDIA COMMUNICATION

(75) Inventors: Peter Michael Melliar-Smith, Santa Barbara, CA (US); Louise Elizabeth Moser, Santa Barbara, CA (US); Chin Chye Koh, Camarillo, CA (US)

(73) Assignee: Nevion USA, Inc., Oxnard, CA (US)

( * ) Notice: Subject to any disclaimer, the term of this patent is extended or adjusted under 35 U.S.C. 154(b) by 845 days.

(21) Appl. No.: 12/358,181

(22) Filed: Jan. 22, 2009

(65) Prior Publication Data

US 2009/0193314 A1 Jul. 30, 2009

Related U.S. Application Data

(60) Provisional application No. 61/023,794, filed on Jan. 25, 2008.

(51) Int. Cl.
*G06F 11/00* (2006.01)

(52) U.S. Cl. ........................................... 714/801

(58) Field of Classification Search ............... 714/801; 370/240.24, 27; 375/240.24, 27
See application file for complete search history.

(56) References Cited

U.S. PATENT DOCUMENTS

| | | | |
|---|---|---|---|
| 3,387,261 A | 6/1968 | Betz | |
| 4,435,807 A | 3/1984 | Scott et al. | |
| 4,599,722 A | 7/1986 | Mortimer | |
| 4,769,818 A | 9/1988 | Mortimer | |
| 4,796,260 A | 1/1989 | Schilling et al. | |
| 4,849,976 A | 7/1989 | Schilling et al. | |
| 5,956,757 A * | 9/1999 | Sun .............................. | 711/211 |
| 6,012,159 A | 1/2000 | Fischer et al. | |
| 6,079,042 A | 6/2000 | Vaman et al. | |
| 6,948,109 B2 | 9/2005 | Coe | |

(Continued)

OTHER PUBLICATIONS

Shu Lin & Daniel J. Costello. Jr. Error Control Coding 1983 274-282 Prentice Hall, USA.

(Continued)

*Primary Examiner* — Scott Baderman
*Assistant Examiner* — Neil Miles
(74) *Attorney, Agent, or Firm* — Paul D. Chancellor; Ocean Law

(57) ABSTRACT

This invention relates generally to a packet recovery algorithm for real-time (live) multi-media communication over packet-switched networks, such as the Internet. Such multi-media communication includes video, audio, data or any combination thereof. More specifically, the invention comprises a forward error correction (FEC) algorithm that addresses both random and burst packet loss and errors, and that can be adjusted to tradeoff the recoverability of missing packets and the latency incurred. The transmitter calculates parity packets for the rows, columns and diagonals of a block of multi-media data packets using the exclusive or (XOR) operation and communicates the parity packets along with the multi-media data packets to the receiver. The receiver uses the parity packets to recover missing multi-media data packets in the block. The FEC algorithm is designed to be able to recover long bursts of consecutive missing data packets. If some parity packets are missing, they too can be recovered using an extra single parity packet, so that they can be used to recover other missing data packets. The invention applies to both one-way real-time streaming applications and two-way real-time interactive applications, and to both wired and wireless networks. The invention retains backwards compatibility with existing standards governing FEC for professional video over IP networks.

11 Claims, 27 Drawing Sheets

Array A of packets
D rows, L columns, L diagonals
Each diagonal has slant S
In this example D=5, L=11, S=3

Transmitter and Receiver

U.S. PATENT DOCUMENTS

| | | | | |
|---|---|---|---|---|
| 7,197,685 | B2 | 3/2007 | Limberg | |
| 7,509,564 | B2 * | 3/2009 | Dohmen et al. | 714/782 |
| 7,712,008 | B2 * | 5/2010 | Song et al. | 714/755 |
| 2004/0250196 | A1 * | 12/2004 | Hassner et al. | 714/788 |
| 2005/0138525 | A1 * | 6/2005 | Helbig | 714/766 |
| 2006/0029065 | A1 | 2/2006 | Fellman | |
| 2006/0156198 | A1 | 7/2006 | Boyce et al. | |
| 2008/0016435 | A1 * | 1/2008 | Goel | 714/801 |
| 2008/0055122 | A1 * | 3/2008 | Tan | 341/52 |
| 2008/0222494 | A1 * | 9/2008 | Gondo et al. | 714/776 |
| 2008/0229173 | A1 * | 9/2008 | Chen | 714/756 |
| 2010/0017685 | A1 * | 1/2010 | Huang | 714/774 |
| 2010/0192049 | A1 * | 7/2010 | Lee et al. | 714/804 |
| 2010/0313093 | A1 * | 12/2010 | Takaku | 714/746 |

OTHER PUBLICATIONS

Peter Sweeney Error Control Coding 2002 22-23 John Wiley & Sons, USA.

Robert G. Gallagher Intormation Theory and Reliable Communication 1968 196-201 John Wiley & Sons, USA.

R.J. McEliece The Theory of Information and Coding 2004 267 Cambridge University Press, USA.

P.G. Farrell and S.J. Hopkins Burst Error Correcting Array Codes 1982 188-192 The Radio and Electronic Engineer Journal, vol. 52. No. 4, Apr. 1982, USA.

S.M. Reddy and J.P. Robinson Random Error and Burst Correction by Ileraled Codes 1972 182-185 IEEE Transactions on Informalion Theory, IT-18(2), Jan. 1972, USA.

Y. Wang el al. Error Resiliont Video Coding Techniques 2000 61-82 IEEE Signal Processing Magazine, vol. 17, No. 4, Jul. 2000, USA.

A.J. McAuley Reliable Broadband Communication Using a Burst Erasure Correcting . . . 1990 297-306 Proceedings of ACM SIGCOMM, Sep. 1990, USA.

L. Rizzo Effective Erasure Codes for Reliable Computer Communications Protocols 1997 24-36 Computer Communication Review, vol. 27, No. 2, Apr. 1997.

J. Rosenberg and H. Schulzrinne An RTP Payload Format for Generic Forward Error Correction (internal draft) 1999 1-22 http://www.letf.org/rfc/rfc2733.txt.

M. Blaum et al. A Class of Burst Error-Correcting Array Codes 1986 836-839 IEEE Transactions on Information Theory. vol. IT-32, No. 6. Nov. 1986. USA.

* cited by examiner

Array A of packets
D rows, L columns, L diagonals
Each diagonal has slant S
In this example D=5, L=11, S=3

Transmitter and Receiver

Transmitter
Computation of row parity packets

Transmitter
Computation of column parity packets

Transmitter
Computation of diagonal parity packets

Transmitter and Receiver
Computation of the single parity packet for the parity packets

Figure 5A
Receiver
Array A of data packets
D=5, L=11, S=3
X denotes a missing data packet

| | c0 | c1 | c2 | c3 | c4 | c5 | c6 | c7 | c8 | c9 | c10 |
|---|---|---|---|---|---|---|---|---|---|---|---|
| r0 | d10 | d9 | X d8 | d7 | d6 | d5 | d4 | X d3 | d2 | d1 | d0 |
| r1 | d7 | d6 | d5 | X d4 | X d3 | X d2 | X d1 | X d0 | X d10 | X d9 | X d8 |
| r2 | X d4 | X d3 | X d2 | X d1 | X d0 | X d10 | X d9 | X d8 | X d7 | X d6 | X d5 |
| r3 | d1 | X d0 | d10 | d9 | d8 | d7 | d6 | d5 | d4 | d3 | d2 |
| r4 | X d9 | d8 | d7 | X d6 | d5 | d4 | d3 | d2 | d1 | d0 | d10 |

Figure 5B
Receiver
Boolean Array B
B[i,j] = 1 Data packet received
B[i,j] = 0 Data packet missing

| | c0 | c1 | c2 | c3 | c4 | c5 | c6 | c7 | c8 | c9 | c10 |
|---|---|---|---|---|---|---|---|---|---|---|---|
| r0 | 1 | 1 | 0 | 1 | 1 | 1 | 1 | 0 | 1 | 1 | 1 |
| r1 | 1 | 1 | 1 | 0 | 0 | 0 | 0 | 0 | 0 | 0 | 0 |
| r2 | 0 | 0 | 0 | 0 | 0 | 0 | 0 | 0 | 0 | 0 | 0 |
| r3 | 1 | 0 | 1 | 1 | 1 | 1 | 1 | 1 | 1 | 1 | 1 |
| r4 | 0 | 1 | 1 | 0 | 1 | 1 | 1 | 1 | 1 | 1 | 1 |

Figure 5C
Receiver

Number of missing data packets in each row

| | r0 | r1 | r2 | r3 | r4 |
|---|---|---|---|---|---|
| NR | 2 | 8 | 11 | 1 | 2 |

Number of missing data packets in each column

| | c0 | c1 | c2 | c3 | c4 | c5 | c6 | c7 | c8 | c9 | c10 |
|---|---|---|---|---|---|---|---|---|---|---|---|
| NC | 2 | 2 | 2 | 3 | 2 | 2 | 2 | 3 | 2 | 2 | 2 |

Number of missing data packets in each diagonal

| | d0 | d1 | d2 | d3 | d4 | d5 | d6 | d7 | d8 | d9 | d10 |
|---|---|---|---|---|---|---|---|---|---|---|---|
| ND | 3 | 2 | 2 | 3 | 2 | 1 | 2 | 1 | 3 | 3 | 2 |

Figure 5D
Receiver

Rows with exactly one missing data packet

| R1 | 3 | | | | |
|---|---|---|---|---|---|

Columns with exactly one missing data packet

| C1 | | | | | | | | | | | |
|---|---|---|---|---|---|---|---|---|---|---|---|

Diagonals with exactly one missing data packet

| D1 | 5 | 7 | | | | | | | | | |
|---|---|---|---|---|---|---|---|---|---|---|---|

Receiver
D=5, L=11
X denotes a missing parity packet

Receiver

Receiver

Transmitter

Transmitter
Compute parity packet for row i

Transmitter
Compute parity packet for column j

Transmitter
Compute parity packet for diagonal k

Transmitter
or Receiver
Compute single parity packet SP
from row parity packets

Transmitter
or Receiver
Compute single parity packet SP
from column parity packets Transmitter
or Receiver
Compute single parity packet SP
from diagonal parity packets Transmitter Transmitter Receiver Receiver Receiver
Insert data packet P into A[i,j]

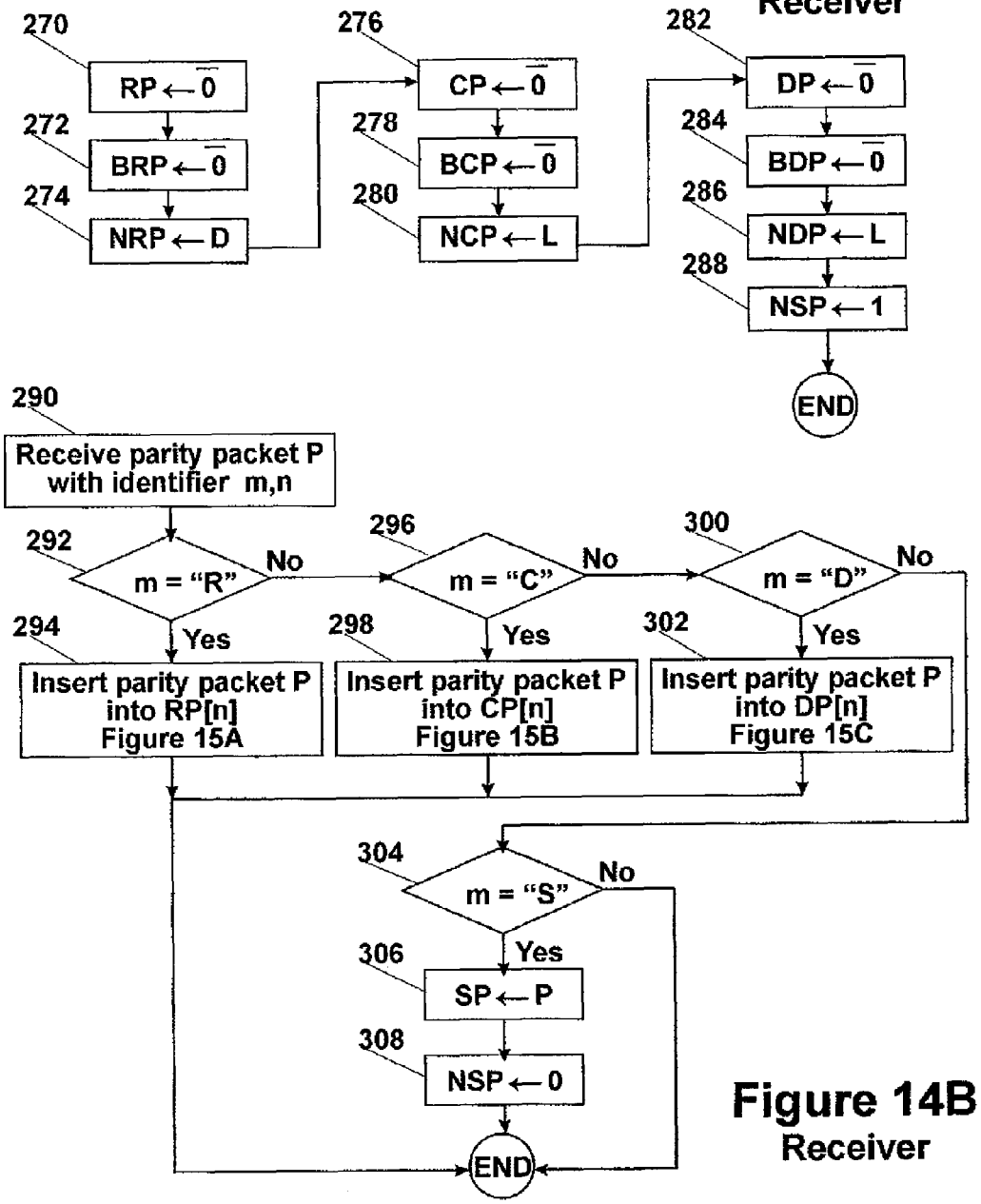

Receiver
Insert row parity packet P into RP[i]

Receiver
Insert column parity packet P into CP[j]

Receiver
Insert diagonal parity packet P into DP[k]

Receiver
Correct parity packets

Receiver
Correct row parity packet
using single parity packet SP

Receiver
Correct column parity packet using single parity packet SP

Receiver
Correct diagonal parity packet using single parity packet SP

Receiver

Receiver
Correct R1[nextR1]

Receiver
Correct C1[nextC1]

Receiver
Correct D1[nextD1]

Transmitter

Receiver

FORWARD ERROR CORRECTION FOR BURST AND RANDOM PACKET LOSS FOR REAL-TIME MULTI-MEDIA COMMUNICATION

PRIORITY CLAIM

This application claims the benefit of U.S. Provisional Patent Application No. 61/023,794 filed Jan. 25, 2008.

BACKGROUND OF THE INVENTION

Field of the Invention

The present invention relates generally to the electrical arts and methods of the electrical arts. In particular, the disclosure relates to packet recovery and a packet recovery method for real-time (live) multi-media communication over packet-switched networks such as the Internet.

Problems Identified By The Inventors

Packet loss in packet-switched networks, like the Internet, results from network congestion, switch contention and the consequent buffer overflow, and from noise and interference on the links that comprise the network. Moreover, packets are not necessarily received in the order in which they were transmitted. The probability of packet loss depends on the capacity of the network actually being used. In addition to packet loss, these network characteristics result in unpredictable latency and jitter, all of which are undesirable for real-time multi-media communication.

Fiber optic networks that span the continental United States, and that interconnect continents via transoceanic cables, have very high network capacity and very low noise and interference over their individual links. In such long-haul networks, most packet loss results from electronic switching and buffers, rather than from optical transmission. Retransmission requests and retransmissions can cause buffer overflow and can exacerbate the problem of packet loss. For real-time multi-media communication, packet loss results in poor video/audio quality.

Wireless networks are characterized by low data rates and high error rates. In wireless networks, packet loss results from network congestion and interference due to physical objects and competing transmitters. Bursts of corrupt or lost packets are quite common in wireless networks. For multi-media communication, packet loss results in poor video/audio quality and also increased power consumption for the wireless devices.

Digital video involves encoding moving pictures into a digital signal, transmitting the digital signal, and decoding the digital signal into a viewable format on a television screen, computer monitor or cell phone. To use the network bandwidth efficiently, it is necessary to compress video frames because, otherwise, a very large number of digital bits would have to be transmitted.

The Motion Picture Experts Group (MPEG) has developed the MPEG-2 compression standard for digital video, which addresses the format of a compressed bit stream and the combining of video, audio and data into single or multiple streams for transmission or storage. MPEG-2 uses both spatial redundancy (redundancy within a single video frame) and temporal redundancy (redundancy between consecutive frames). MPEG-4 is a variant of MPEG for low-bandwidth video telephony, such as wireless networks.

The Joint Photographic Experts Group (JPEG) has developed the JPEG 2000 compression standard, which can be used for both still and moving pictures. JPEG 2000 uses only spatial redundancy, without any dependency between consecutive frames. JPEG 2000 (J2K) is the leading digital film standard currently supported by the Digital Cinema Initiative (a consortium of major studios and vendors) for the storage, distribution and exhibition of motion pictures. JPEG 2000 does not employ temporal or inter-frame compression; instead, each frame is encoded as an independent entity using either a lossy or lossless variant of JPEG 2000. The lossless variant of JPEG 2000 runs slightly slower and has lower compression ratios.

For efficiency, both MPEG and JPEG use compression of video frames. The most efficient kind of compression, variable bit rate compression, can result in large bursts of data and, thus, contribute further to network congestion, switch contention and buffer overflow and, thus, unpredictable packet loss, latency and jitter.

With both MPEG and JPEG compression, the effect of unreliable network communication is exacerbated, because lost or erroneous packets make it difficult (or impossible) to decompress a transmitted video image and reconstruct it at the receiver. Thus, for video communication, there is a need to mitigate the unreliability of the communication network and to improve the quality of the delivered image.

In addition to low packet loss rates, real-time multi-media communication, particularly video and audio, require low latency (typically, the response time of a human) and low jitter so that the quality of service is acceptable to the end user.

Feedback-based error correction, such as automatic retransmission request (ARQ), which is based on negative acknowledgements (NACKs) and retransmissions, introduces significant latency and jitter into packet transmissions. These characteristics make ARQ unacceptable for real-time multi-media communication.

For long-haul networks, forward error correction (FEC) can be used to recover missing packets while significantly reducing the latency and jitter, because the receiver does not need to transmit retransmission requests to the transmitter and to receive retransmissions from the transmitter. With an appropriate FEC hardware implementation, the FEC encoding and decoding times are small compared to the communication time.

In coding theory, an error is a corrupted symbol (or bit) with an unknown value in an unknown location, whereas an erasure is a corrupted symbol (or bit) with an unknown value in a known location. A forward error correction (FEC) code has R parity (checksum) symbols (or bits) added to K data symbols (or bits) to form an N=K+R codeword. The R parity symbols are added in such a way to allow a number of errors and erasures to be corrected. FEC codes are characterized by their algorithms for encoding and decoding the data symbols. The redundancy (overhead) of a FEC code is the ratio of parity symbols to data symbols, i.e., R/K. Increasing the redundancy increases the ability to correct errors and erasures, and the patterns of errors and erasures that can be corrected. The cost of increased redundancy is increased latency, due to the increased computation and communication cost. By replacing an error with an erasure, the error correcting power of the code is approximately doubled (R. J. McEliece, The Theory of Information and Coding, Addison Wesley, 2004).

The present invention addresses erasures (packet losses) not only because the error correction power of the code is increased, but also because the lower layers of the Internet protocol stack, specifically the User Datagram Protocol (UDP), over which the FEC algorithm runs, drops packets that contain errors.

As applied to the recovery of missing packets, at the transmitter, an FEC algorithm adds some number of redundant packets, called parity (or checksum) packets, to a block of multi-media data packets to protect those packets from packet loss or corruption. The parity packets are transmitted along with the multi-media data packets to the receiver. At the receiver corrupted packets are detected and discarded and, thus, are not delivered to the receiver. At the receiver, the FEC algorithm can recover one or more missing multi-media data packets in the block by combining the parity packets with the multi-media data packets that were received to reconstruct the missing data packets from the block.

The number of missing data packets in a block that an FEC algorithm can recover is limited to the number of parity packets for the block, i.e., each parity packet can recover one missing data packet. The number of parity packets, and the number and choice of data packets used to compute a parity packet, results in a tradeoff between overhead, latency and recoverability of lost packets. The actual packet loss rate and network bandwidth, and the desired recoverability and latency, must be considered in determining the number of parity packets and their construction.

For coding efficiency, it is better to have a large block, because more protection can be provided for the same redundancy, because there are more parity packets and each parity packet covers more data packets. Large blocks that encompass many data packets and that require hundreds of milliseconds or seconds to transmit also help to overcome packet losses that occur in bursts.

Variable packet loss rates, variable transmission rates, and variable compression rates, coupled with the need to minimize latency, present challenges to the design and implementation of forward error correction for packet-based real-time multi-media communication.

For variable compression rates, a transmitter implementing forward error correction must wait an indeterminate amount of time for enough multi-media data packets to accumulate to fill the block of multi-media data packets before it can generate parity packets. To smooth out the jitter in the data stream, output buffering must be used at the transmitter. Such output buffering contributes additional latency to the stream.

For variable transmission rates, a receiver implementing forward error correction might wait an indeterminate amount of time for all parity packets for a data block to arrive before it can recover the missing packets, resulting in increased latency and jitter at the receiver. To smooth out the jitter in the multi-media data stream, input buffering must be used at the receiver. Such input buffering contributes additional latency to the stream.

Description of the Prior Art

Forward error correction (FEC) codes and algorithms have been proposed for the correction of errors and erasures (losses) of bits and symbols (packets) in the prior art.

Specific forward error correction codes in the prior art include block codes, convolutional codes, low density parity check codes, turbo codes, fire codes, Hamming codes and Reed Solomon codes. Each of these codes employs a different algorithm for generating the parity bits/symbols and a different algorithm for recovering the original data bits/symbols. Books describing such prior art include (R. G. Gallager, Information Theory and Reliable Communication, John Wiley & Sons, Inc., 1968); (S. Lin and D. J. Costello, Jr., Error Control Coding: Fundamentals and Applications, Prentice-Hall, Inc., 1983); (P. Sweeney, Error Control Coding, John Wiley & Sons, Inc., 2002); and (R. J. McEliece, The Theory of Information and Coding, Cambridge University Press, Student Edition, 2004).

Forward error correction techniques to support real-time multi-media communication on the Internet and over wireless networks have been considered in the prior art (J. Rosenberg and H. Schulzrinne, IETF RFC 2733, An RTP payload format for generic forward error correction, Internet draft, February 1999, http://info.internet.isi.edu:80/in-drafts/files/draft-ietf-avt-fec-05.txt), (Society of Motion Picture and Television Engineers, SMPTE 2002-2-2007, Forward Error Correction for Real-Time Video/Audio Transport Over IP Networks, http://store.smpte.org/product-p/smpte%20202-1-2007.htm), and (Society of Motion Picture and Television Engineers, SMPTE 2002-2-2007, Unidirectional transport of constant bit rate MPEG-2 transport streams on IP networks, http://store.smpte.org/product-p/smpte%20202-2-2007.htm). The ProMPEG Code of Practice #3 defined in the two latter documents are specified only for MPEG-2 video compression, and works only for constant bit rate, despite the fact that variable bit rate is more efficient. The FEC methods defined in both of these documents compute row (horizontal) and column (vertical) parity packets on a block of data packets using the XOR operation. They use a vertical parity packet to recover a single missing data packet in a column and a row parity packet to recover two missing data packets in a column.

U.S. Pat. No. 3,387,261 by Betz describes an apparatus for detecting and correcting errors in data particularly when the data are being transferred from a main memory to a secondary storage device such as a magnetic tape. The apparatus uses the XOR operation to compute the parity bits, and includes a pair of transfer registers for storing the parity bits and the data bits. Before a frame is transferred, the apparatus generates a parity bit for that frame (referred to as a short check). To handle errors in corresponding bit positions of successive frames (referred to as a burst error), the apparatus generates a parity bit for the data in those bit positions (referred to as a long check). The invention also describes computing a parity bit by referencing data in a time-oriented manner (which is referred to as a diagonal check), but concludes that doing so offers little more than a short check. An object of the invention is to perform error detection and correction in a continuous and parallel manner by means of short and diagonal parity bits, where diagonal means computing a parity bit using bit 1 of frame 1, bit 2 of frame 2, bit 3 of frame 3, i.e., along a diagonal with a −45 degree slope.

U.S. Pat. No. 4,435,807 by Scott and Goetschel describes an error correction system that computes error correction parity bits using the XOR operation for rows and diagonals at a 45 degree angle in a V-shaped pattern. The system uses a first error correction circuit that corrects single errors in the data, error detection bits and error corrections bits, and a second error correction circuit that receives the data from the first error correction circuit after the single errors have been corrected and corrects the residual multiple errors. The system aims to correct errors, rather than erasures which the present invention aims to correct.

U.S. Pat. No. 4,599,722 by Mortimer describes an apparatus for encoding and decoding digital data to permit correction of a single bit error in a sequence of data packets (bytes) using Galois field arithmetic to form the parity packet (byte). U.S. Pat. No. 4,769,818 also by Mortimer describes a method and apparatus for coding digital data to permit correction of one or two incorrect data packets (bytes). Each data byte comprises data bits and one parity check bit. To encode the sequence of data bytes, two code bytes are determined from the data bytes. The data bytes and the code bytes form an encoded data block. The data blocks are grouped into bundles of data blocks. A bundle is a two-dimensional array of bytes, where the horizontal rows and the vertical columns of the array are encoded separately. The invention is intended to correct bit errors in bytes, rather than to recover lost packets, and does not use diagonals like the present invention.

U.S. Pat. No. 4,796,260 describes the Schilling Manela forward error correction and detection method and apparatus. Their method uses two or more lines (diagonals) of data symbols (or bits) with different slopes and calculates parity symbols for each of those lines. The slopes may be all positive or all negative or some combination thereof. For a line of data symbols having p-bits per symbol, the method uses mod 2.sup.p arithmetic to form the parity symbol. The algorithm employs a composite error graph and a threshold. For each data symbol, the composite error graph keeps track of the number of errors in the lines that contain that symbol. The algorithm starts with the symbol that has the largest number of errors beyond the threshold. It chooses a new data symbol to minimize that number, and substitutes that data symbol into the sequence of data symbols. Thus, the algorithm of Schilling and Manela differs from the present algorithm, which starts with a row, column or diagonal that has the smallest number of missing packets, i.e., a single missing packet and recovers that packet. U.S. Pat. No. 4,849,976 by Schilling and Manela builds on the above invention by appending the parity rows to the bottom of the data block. It calculates the first set of parity symbols (bits) on the data symbols (bits) in the first line (diagonal), the second set of parity symbols on both the data symbols (bits) in the second line and the parity symbols (bit) in the first line, and so on.

U.S. Pat. No. 6,012,159 by Fischer and Paleologou describes a method and system for error-free data transfer in satellite broadcast networks and other networks. Their invention is based on Galois fields and Vandermonde matrices and use matrix inversion and multiplication, which are more expensive operations than the XOR operation used in the present invention.

U.S. Pat. No. 6,079,042 by Vaman, Chakravarthy and Hong applies to ATM and other networks where, in one embodiment, the ATM adaptation layer selectively implements error recovery, depending on the type of data transmitted, e.g., video or audio. The method segments the data into blocks of data packets (cells) of a pre-determined size, D×L and calculates vertical and diagonal parity packets (cells) for the block. The diagonal in their patent is quite different from the diagonal in the present invention. In their invention, there are L vertical parity packets and D+L diagonal parity packets. A vertical parity packet is formed by using modulo 2 addition of the data packets in a column of the block. The D+L diagonal parity packets are formed by XORing varying numbers of data packets after skewing the block.

U.S. Pat. No. 6,948,109 by Coe uses pseudo-diagonals for low density parity check (LDPC) forward error correction. The invention extends a portion of the original LDPC matrix such that the LDPC code becomes a periodic repeating code. The feature of Coe's method is that data packets are processed incrementally as they are received, rather than periodically as a block when the entire block is received as in the present invention. The disadvantage of processing the data packets incrementally is there is a difference in the amount of time required for the best case and the worst case, which introduces jitter.

U.S. Pat. No. 7,197,685 by Limberg uses Reed Solomon forward error correction for transmitted digital television signals and MPEG-2 data packets. Reed Solomon codes incur relatively high computational costs and are difficult to use at the high data rates used for High Definition Television signals. The present invention achieves almost the same recoverability for the same number of parity packets as Reed Solomon codes without incurring the high computational cost.

U.S. patent application 20060029065 by Fellman describes a system and method for low-latency content-sensitive forward error correction for MPEG-encoded video and audio streams, with more protection for MPEG I-Frames and audio frames. The method is based on Galois field arithmetic, which is computationally more expensive than the XOR operation used in the present invention. Moreover, it uses only rows and column and, thus, can handle only relatively short bursts of erasures, unlike the present invention which also uses diagonals and, thus, can handle longer bursts of erasures.

U.S. patent application 20060156198 by Boyce and Zheng presents the inventors' Complete User Datagram Protocol (CUDP) for multi-media traffic on wireless packet networks that identifies corrupted frames and uses forward error correction. UDP discards packets with corrupted headers and/or corrupted payload. UDP Lite discards only packets with corrupted headers. CUDP corrects UDP erasures and UDP Lite erasures and errors. The patent does not define a new FEC code or algorithm but uses an existing maximum distance separable packet code, such as the Reed Solomon code, that uses vertical (column) packet coding, long vertical packet coding in which several columns participate in a parity check, or horizontal (row) and vertical (column) packet coding.

The article (S. M. Reddy and J. P. Robinson, Random error and burst correction by iterated codes, IEEE Transactions on Information Theory, IT-18(2), pp. 182-185, January 1972) describes a method for burst and random error correction by iterated codes that uses row and column parity checks, where the columns are decoded before the rows and information in the form of weights is conveyed to the next step of the row decoding. The decoding consists of erasing the positions in the word with the smallest weight and then the next largest weight, etc. With computationally inexpensive distance 1 codes, this strategy can correct bursts of length L for a D×L block. The present invention can correct a larger class of patterns of simultaneous burst and random packet loss (erasures) and can correct a burst of length less than or equal to 2×L−S erasures.

The article (P. G. Farrell and S. J. Hopkins, Burst error-correcting array codes, The Radio and Electronic Engineer Journal, vol. 52, no. 4, pp. 182-192, April 1982) describes array codes for correcting bursts that include both errors and erasures. Their method uses column and −45 degree (slope −1) diagonal parity checks with row-by-row transmission of data packets or, alternatively, column and row parity checks with −45 degree diagonal transmission of data packets. It does not use row, column and diagonal parity checks like the present invention does.

The article (M. Blaum, P. G. Farrell and H. C. A. Van Tilborg, A class of burst error-correcting array codes, IEEE Transactions on Information Theory, vol. IT-32, no. 6, November 1986) notes that an array code in which the last row and the last column contain redundant bits can correct any single error and demonstrates that, if the bits are read (transmitted) diagonally instead of horizontally, the code can correct bursts of errors of length up to L if and only if D .geq. 2×(L−1). The present invention corrects only erasures (missing packets), but can correct as many as 2×L+D−3 erasures with much smaller values of D.

The paper (A. J. McAuley, Reliable broadband communication using a burst erasure correcting code, Proceedings of ACM SIGCOMM, pp. 297-306, September 1990) describes a burst erasure correcting code for loss due to congestion in broadband networks that uses a simplified Reed Solomon code as a complement to automatic retransmission requests. Reed Solomon codes incur relatively high computational costs, and are difficult to use at the high data rates used for High Definition Television signals.

The paper (N. Shacham and P. McKenney, Packet recovery in high-speed networks using coding and buffer management, Proceedings of IEEE INFOCOM, pp. 124-131, 1990) describes a forward error correction method for packet recovery in high-speed networks. The data packets are arranged in a two-dimensional array, and a parity packet is added to each row and column using the XOR operation on the bits in the packets in the respective row or column. The parity packets are computed as follows. The first bit of a parity packet is the XOR of the first bit of the data field of all packets comprising the block. The second bit of the parity packet is the XOR of the second bit of the data field of all packets comprising the block, etc. If the packets are transmitted by rows, the column parity packets are used to recover a burst of missing packets of any length less than or equal to the number of columns, and the row parity packets are used to recover additional missing packets scattered across the array. The present invention uses diagonals in addition to rows and columns and, thus, is able to recover longer burst erasures and more random erasures than the scheme of Shacham and McKenney.

The article (L. Rizzo, Effective erasure codes for reliable computer communication protocols, Computer Communication Review, vol. 27, no. 2, pp. 24-36, April 1997) presents a general overview of erasure codes for forward error correction. In particular, it discusses the use of Vandermonde matrices computed over the Galois field $GF(p^r)$ for erasure codes. Such codes require matrix multiplication and inversion, which are more costly operations than the simple XOR operation.

The article (Y. Wang, S. Wenger, J. Wen and A. K. Katsaggelos, Error resilient video coding techniques, IEEE Signal Processing Magazine, vol. 17, no. 4, pp. 61-82, July 2000) discusses error-resilient video coding techniques for real-time video communication over unreliable networks. In particular, it reviews the state-of-the-art for the H.323 and MPEG-4 standards. It does not introduce or discuss any particular FEC code or algorithm.

It will be evident to those skilled in the art that selected embodiments of the present invention address one or more of the shortcomings evident in these references.

SUMMARY OF THE INVENTION

Various embodiments of the invention are disclosed herein. The structure, features and capabilities of the described embodiments are exemplary and are for the purpose of teaching a person of ordinary skill in the art how to make and use the invention. These descriptions should therefore not be used to limit the scope of the invention. In particular, the claims to the invention are not limited by the structure, features or capabilities of any particular embodiment disclosed herein.

The present invention addresses the problem of loss and corruption of data such as packets for real-time (live) multi-media (video, audio, data) communication over packet-switched networks, such as the Internet. Various embodiments include a packet recovery algorithm for communication over networks and, more specifically, a forward error correction (FEC) algorithm for handling random and/or burst packet loss and errors. Exemplary implementations apply to one-way real-time streaming applications, two-way real-time interactive applications, and to wired and/or wireless networks. Embodiments of the invention are backwards compatible with existing standards that govern FEC algorithms in the transport of professional video over IP (SMPTE 2022). For clarity, we distinguish between the algorithm described in this patent as "advanced FEC" and the standards compliant algorithm as SMPTE 2022 FEC.

The packets containing the multi-media data are arranged, at the transmitter and at the receiver, as a two-dimensional block with D rows and L columns, where 1 .lt. D .leq. L. The invention also utilizes L diagonals for the block, each having slant S and containing D entries, where 1 .leq. S .lt. L.

The values of D and L are selected so that the multi-media data to be communicated, such as a video or audio frame, can be accommodated in D×L packets. The values of L and S are selected so that the anticipated maximum length of a burst of missing packets is less than or equal to 2×L−S. Some longer burst erasures can be corrected, and some additional random losses can also be corrected. The number of missing data packets that can be corrected is less than or equal to 2×K+D−3. The values of D, L and S are selected such that D×S and L are relatively prime, i.e., D×S and L have no common divisor other than 1 and such that, for all n, where 1 .leq. n .leq. D−1, 2×n×S is not a multiple of L.

The FEC algorithm at the transmitter calculates parity packets for the rows, columns and diagonals of the block of multi-media data packets using the exclusive or (XOR) operation and communicates the parity packets along with the multi-media data packets to the receiver.

The method of generating and communicating parity packets can be configured to be backwards compatible with existing standards defined in SMPTE 2022-1-2007 and SMPTE 2022-2-2007. When so configured, all packets (media, row parity, column parity, diagonal parity) are transmitted according to SMPTE 2022-1-2007. All media packets are transmitted to UDP port X. Column parity packets are transmitted to UDP port X+2. Row parity packets are transmitted to UDP port X+4. Diagonal parity packets are transmitted to UDP port X+6.

The FEC algorithm at a SMPTE 2022 compliant receiver ignores the diagonal parity packets and uses only the row and column parity packets to reconstruct the missing multi-media data packets. The FEC algorithm at the receiver uses the parity packets to reconstruct missing multi-media data packets for rows, columns and diagonals that contain exactly one missing packet by taking the XOR of the parity packet for that row, column or diagonal with the received packets in that row, column or diagonal.

At the receiver, the FEC algorithm utilizes a Missing Data Packets data structure to keep track of the rows, columns and diagonals that still contain missing data packets that have not yet been recovered. It utilizes a Single Missing Data Packets data structure to record those rows, columns and diagonals that contain exactly one missing data packet. It also utilizes a Number of Missing Data Packets data structure that maintains the numbers of missing data packets in each row, column and diagonal.

The algorithm proceeds by correcting the rows, columns and diagonals with exactly one missing data packet. It inserts the reconstructed data packet into the appropriate position in the block, modifies the corresponding position in the Missing Data Packets data structure accordingly and decrements the numbers for the row, column and diagonal that contain the missing data packet in the Number of Missing Data Packets data structure. If the number for that row, column or diagonal now equals one, the algorithm inserts the index of that row, column or diagonal into the Single Missing Data Packets data structure. The algorithm regards recovered packets as received data packets, which trigger further attempts at recovery using parity packets that have not yet been used. If there is still a row, column or diagonal that has exactly one missing packet, the algorithm proceeds to process the next row, column or diagonal in the Single Missing Packets data structure. This process continues until there are no more rows, columns or diagonals that contain a single missing packet.

To provide protection of the parity packets at the transmitter or at the receiver, the algorithm calculates a single parity packet for all three sets of parity packets (rows, columns and diagonals). If a parity packet for a row, column or diagonal is missing, the receiver using the single parity packet to recover the missing parity packet.

At the receiver, the FEC algorithm utilizes a Missing Parity Packets data structure to keep track of the received and missing row parity packets, column parity packets and diagonal parity packets. It also utilizes a Number of Missing Parity Packets data structure to record the numbers of missing row parity packets, column parity packets and diagonal parity packets, and single parity packet. If the single parity packet is missing, the algorithm correct (reconstructs) that packet first. Otherwise, if there is a single missing row parity packet or a single missing column parity packet or a single missing diagonal parity packet, the algorithm uses the single parity packet to recover the missing parity packet.

The present invention provides recovery of both random missing packets and bursts of missing packets. Column and diagonal parity packets together handle a burst of missing packets of length up to 2×L−S. Two bursts of missing packets with a combined length less than or equal to 2×L−S can also be corrected. There are some patterns of three bursts of missing packets with a smaller combined length that cannot be corrected. Row parity packets handle random missing packets in rows that are not affected by a burst of missing packets.

While the invention includes several objectives, claims to the invention may encompass some or none of these objectives.

An object of the present invention is to provide a forward error correction algorithm for recovery of missing packets in a packet-based network, such as the Internet.

Another object of the present invention is to provide a forward error correction algorithm for missing multi-media data packets.

A further object of the present invention is to provide a forward error correction algorithm that is capable of recovering both random missing packets and bursts of missing packets.

A further object of the present invention is to provide a forward error correction algorithm that provides flexibility in deployment and considers tradeoffs in packet loss recoverability, communication and computation overheads, and additional latency incurred and bandwidth used.

A still further object of the present invention is to provide a forward error correction algorithm that is easier to implement and more efficient than other algorithms described in the prior art.

A still further object of the present invention is to correct a larger class of patterns of burst and random packet loss and errors than other algorithms in the prior art.

An additional object of the present invention is to provide a forward error correction algorithm that is less complex and more powerful than other algorithms described in the prior art.

An additional object of the present invention is to allow backwards compatibility with receivers that comply with existing standards.

BRIEF DESCRIPTION OF THE DRAWINGS

The above objects and further advantages of the invention can be better understood by referring to the following description in conjunction with the accompanying drawings:

FIG. 5 is a set of diagrams that show the preferred embodiments of the data structures at the receiver for the multi-media data packets. FIG. 5A shows an array A of multi-media data packets with received or recovered and missing data packets. FIG. 5B shows the Missing Data Packets data structure, which in the preferred embodiment is a Boolean array B of received or recovered and missing data packets. FIG. 5C shows the Number of Missing Data Packets data structure, which in the preferred embodiment comprises three vectors NR, NC and ND that indicate the numbers of missing data packets in each row, column and diagonal, respectively. FIG. 5D shows the Single Missing Data Packets data structure, which in the preferred embodiment comprises three vectors R1, C1 and D1 that contain the indices of the rows, columns and diagonals that contain exactly one missing data packet, respectively.

FIG. 6 is a set of diagrams that show the preferred embodiments of the data structures at the receiver for the parity packets.

FIG. 14 is a set of flow diagrams that show the initialization of the vectors and variables in preparation for the reception of the parity packets at the receiver using the vectors RP, CP and DP, the variable SP, the Boolean vectors BRP, BCP and BDP, and the variables NRP, NBP, NDP and NSP.

DESCRIPTION OF THE PREFERRED EMBODIMENTS

Figure 1:
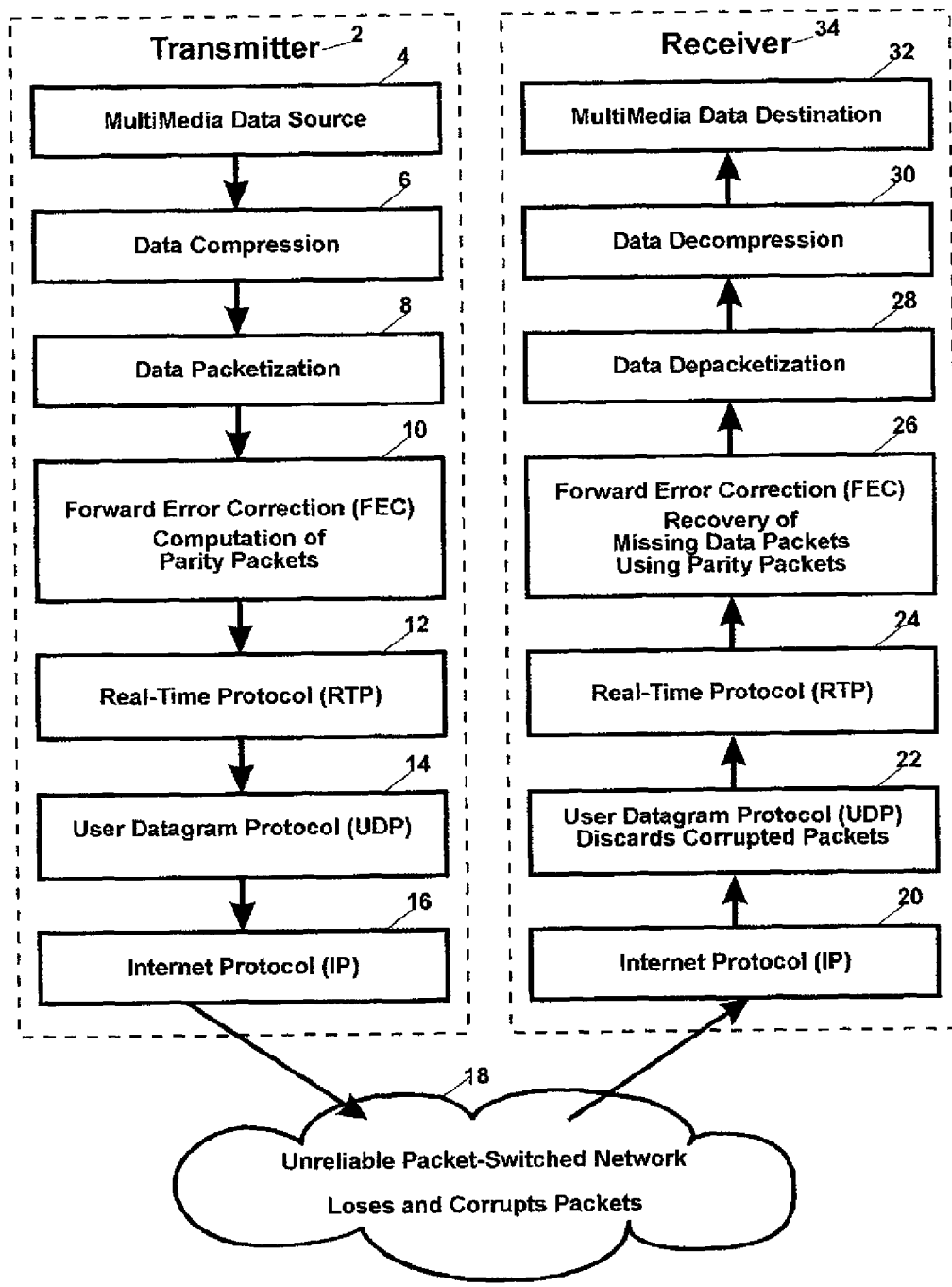
FIG. 1 is a diagram that shows the flow of multi-media data from the transmitter to the receiver.

FIG. 1 is a diagram that shows the flow of multi-media data from the transmitter (2) to the receiver (34). A multi-media data source (4) at the transmitter first submits the multi-media data for data compression (6) and data packetization (8). Next, the packets containing the compressed multi-media data are passed to the Forward Error Correction (FEC) algorithm (10), which computes the parity packets. Then, the packets are passed to the Real-Time Protocol (RTP) (12), which appends a header to the packets. The RTP packets are passed to the User Datagram Protocol (UDP) (14) and then to the Internet Protocol (IP) (16). The IP packets are transmitted over an unreliable packet-switched network (18) such as the Internet, which loses and corrupts packets.

The packet-switched network routes packets to the intended receiver, where they are passed from the Internet Protocol (IP) (20) to the User Datagram Protocol (UDP) (22), which detects and discards corrupted packets. The uncorrupted multi-media data packets are passed to the Real-Time Protocol (RTP) (24) and then to the Forward Error Correction (FEC) algorithm (26), which recovers missing multi-media data packets using the parity packets. Next, the received and recovered multi-media data packets are subjected to data depacketization (28) and data decompression (30). The multi-media data are then passed to the multi-media data destination (32).

Figure 2:
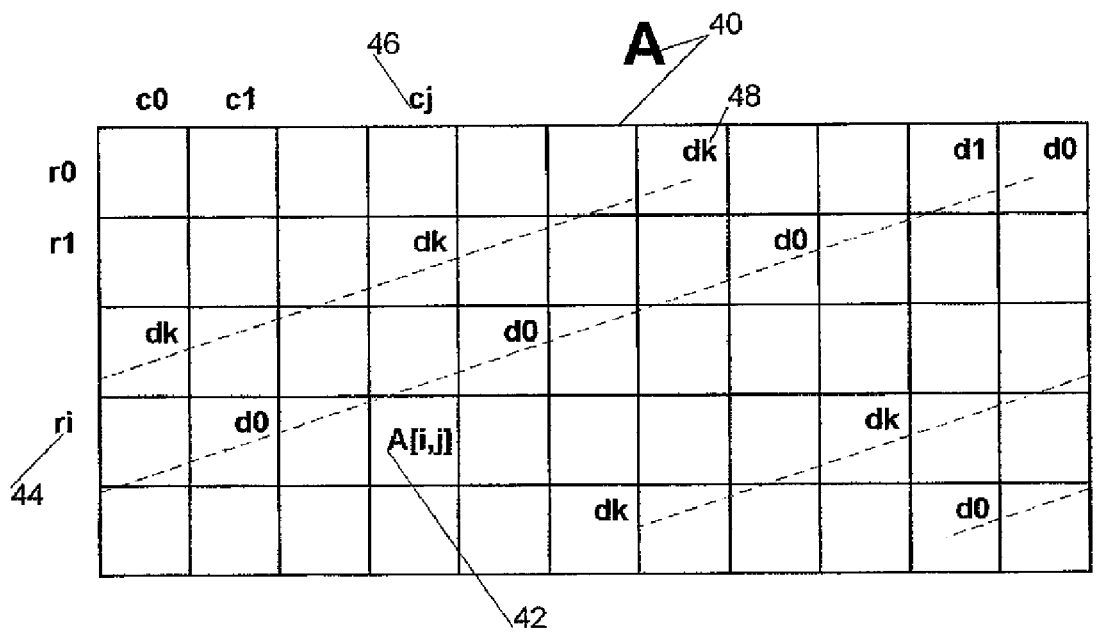
FIG. 2 is a diagram that shows the basic data structure used, at the transmitter and receiver, to contain the multi-media data packets. In the preferred embodiment of the invention, the multi-media data packets are arranged as a two-dimensional block, represented as an array A consisting of D horizontal rows, L vertical columns and L diagonals, each having slant S.

FIG. 2 is a diagram that shows the basic data structure used, at the transmitter and receiver, to contain the multi-media data packets. In the preferred embodiment of the invention, the multi-media data packets are arranged into a two-dimensional block, represented as an array A (40) having D horizontal rows and L vertical columns, where $1 < D \leq L$. The entry $A[i, j]$ (42) occurs in the ith row $r_i$ (44) and the jth column $c_j$ (46), where $0 \leq i \leq D-1$ and $0 \leq j \leq L-1$. Packets in the block are transmitted row by row, from left to right and from top to bottom of the block. The last packet in one row is followed by the first packet in the next row. The present invention also utilizes a set of L diagonals of the array A. Each of the L diagonals has a slant S, where $1 \leq S < L$. The kth diagonal $d_k$ (48) includes the D entries $A[i, (L-1-k-S \times i) \bmod L]$, where $0 \leq i < D$. In this example $D=5$, $L=11$ and $S=3$.

The values of D and L are selected so that the multi-media data, such as a video or audio frame, can be accommodated in $D \times L$ packets, which are communicated from the transmitter to the receiver. The values of L and S are selected so that the anticipated maximum length of a burst of missing packets is less than or equal to $2 \times L - S$. The values of D, L and S are selected so that $D \times S$ and L are relatively prime, i.e., $D \times S$ and L have no common divisor other than 1 and so that, for all n, where $1 \leq n \leq D-1$, $2 \times n \times S$ is not a multiple of L.

Figure 3A:
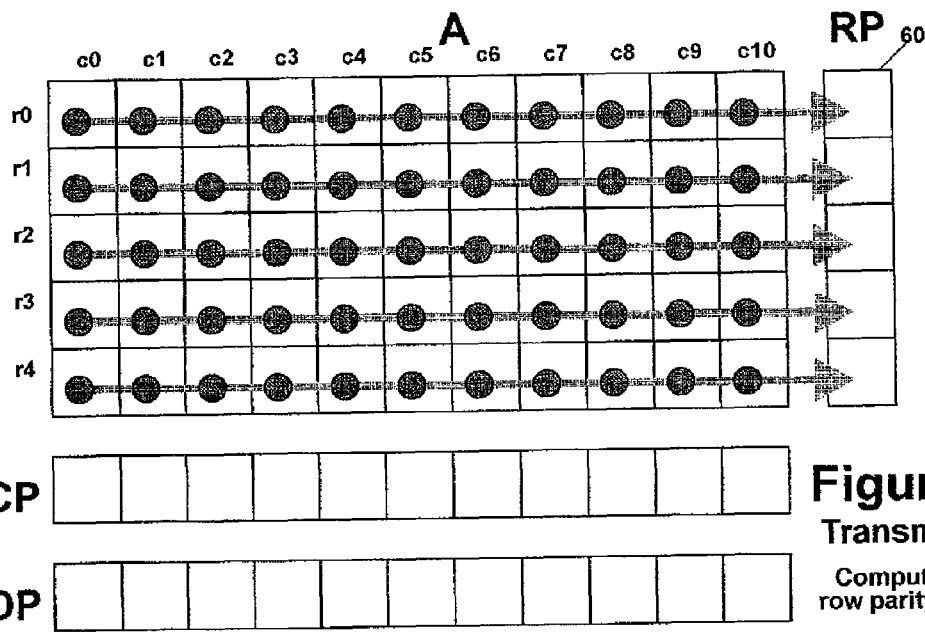
FIG. 3 is a set of diagrams that show, at the transmitter, the data structure used to store the row parity packets, the column parity packets and the diagonal parity packets that the FEC algorithm computes using the exclusive or (XOR) operation on the packets in each row, column and diagonal of the array A of multi-media data packets. In the preferred embodiment of the invention, this data structure comprises three vectors RP, CP and DP.
Figure 3B:
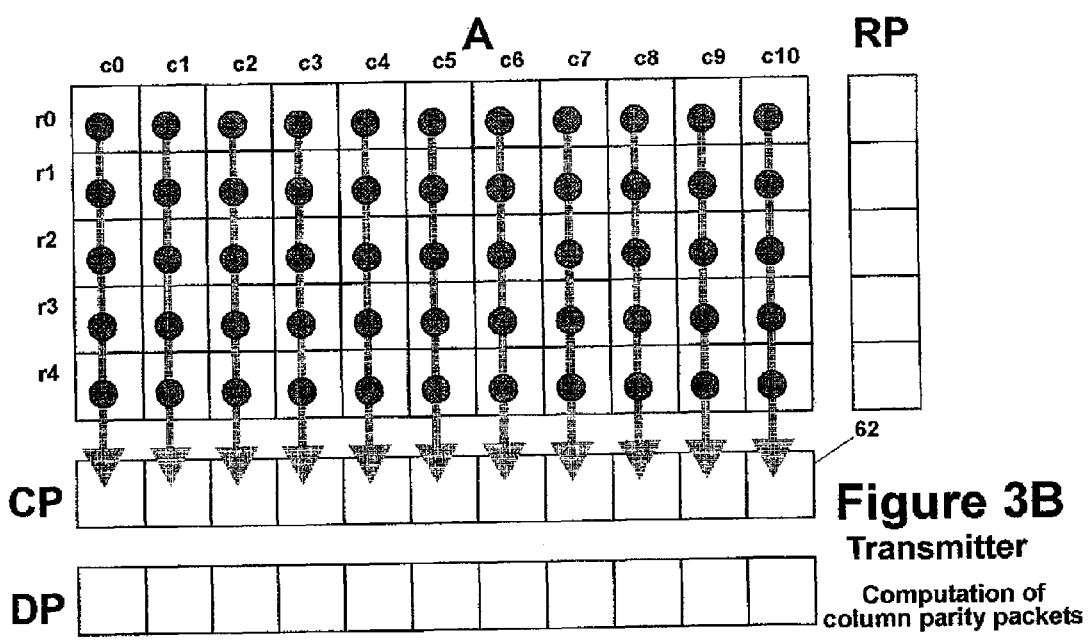
Figure 3C:
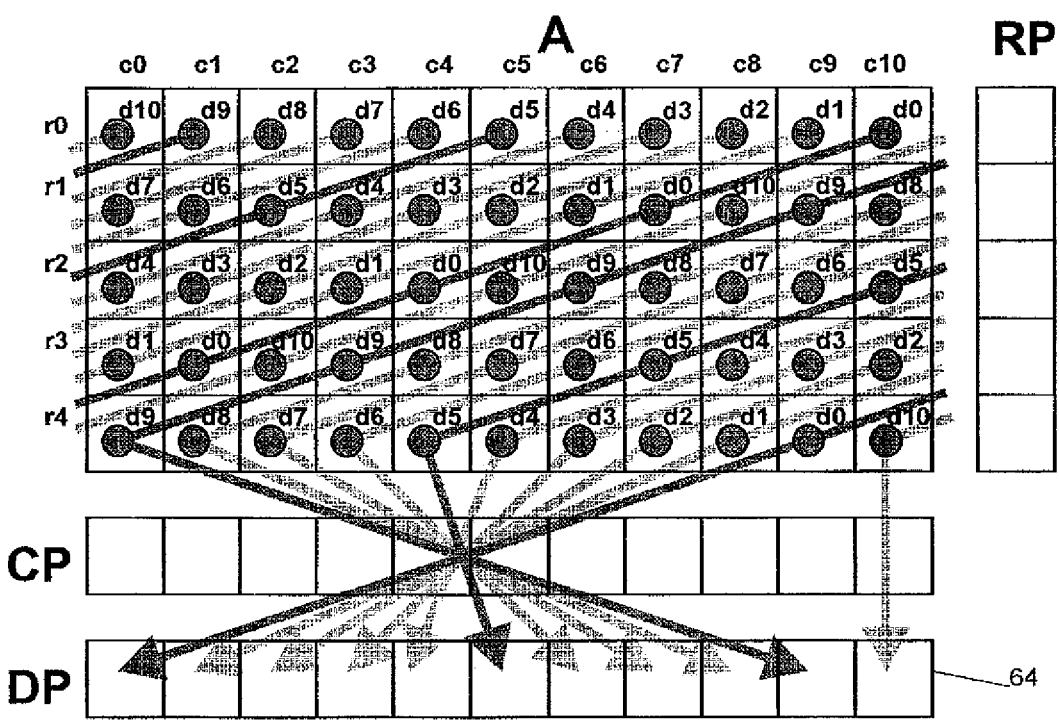

FIG. 3 is a set of diagrams that show, at the transmitter, the data structure used to store the row parity packets, the column parity packets and the diagonal parity packets that the FEC algorithm computes using the exclusive or (XOR) operation on the packets in each row, column and diagonal of the array A of multi-media data packets. In the preferred embodiment of the invention, this data structure comprises three vectors RP, CP and DP. FIG. 3A shows the vector RP (60), which contains D parity packets (one for each row). FIG. 3B shows the vector CP (62), which contains L parity packets (one for each column). FIG. 3C shows the vector DP (64), which contains L parity packets (one for each diagonal).

Figure 4:
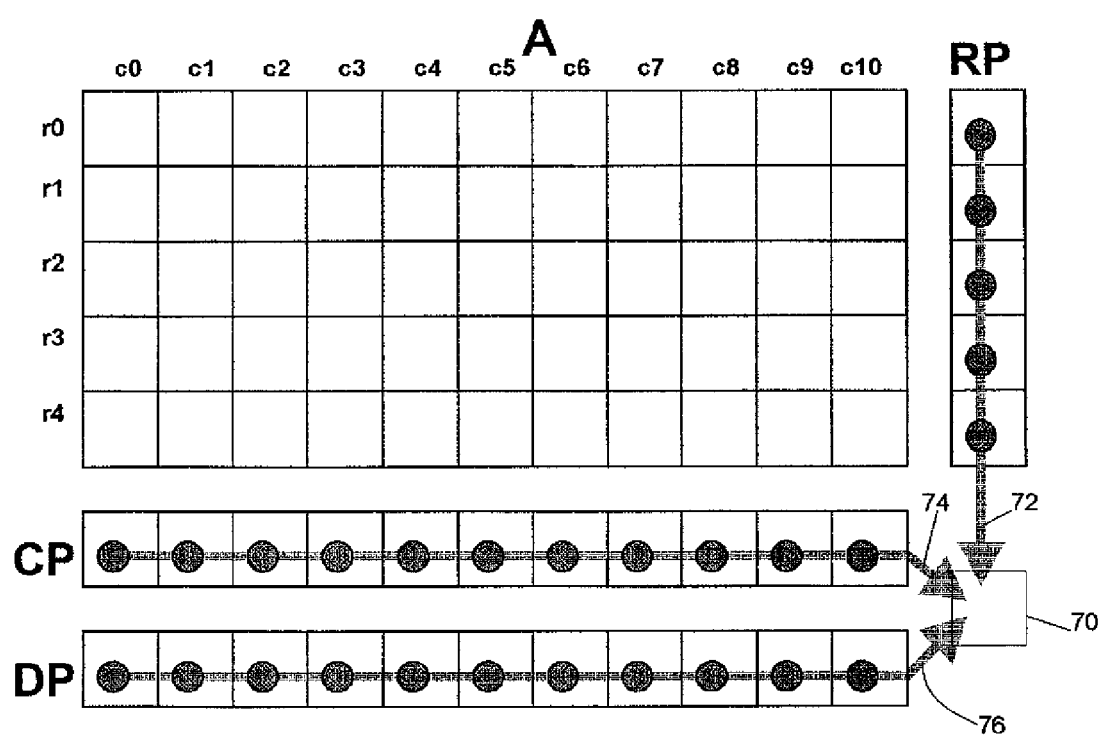
FIG. 4 is a diagram that shows a data structure for an extra single parity packet, which in the preferred embodiment of the invention is a variable SP. The single parity packet is computed optionally at the transmitter or at the receiver either from the row parity packets or from the column parity packets or from the diagonal parity packets.

FIG. 4 is a diagram that shows a data structure for an extra single parity packet, which in the preferred embodiment of the invention is a variable SP. Having generated the row parity packets, column parity packets and diagonal parity packets, the FEC algorithm at the transmitter optionally generates the extra single parity packet SP (70) for the parity packets either by XORing the row parity packets in RP (72) or by XORing the column parity packets in CP (74) or by XORing the diagonal parity packets in DP (76). This single parity packet provides protection for the parity packets against loss and corruption.

At the receiver, the FEC algorithm uses the parity packets that it received from the transmitter to reconstruct single missing packets in the rows, columns and diagonals of the block, and inserts the recovered packets into the array A in place of the missing packets. Corrupted packets are detected and discarded by UDP before they are delivered to the receiver and, thus, are regarded as missing packets. Recovered packets are regarded as received packets, which trigger further attempts at recovery using parity packets that have not yet been used. The FEC algorithm recovers missing packets by correcting the rows, columns and diagonals with a single missing packet and iterates until it cannot recover any more missing packets. Recovery of missing packets proceeds continuously during the reception of packets at the receiver. The recovery algorithm terminates when either all data packets in the block have been received or recovered, or when a timeout indicates that the data packets must be delivered, even if some of them are still missing.

The FEC algorithm at the receiver utilizes a Missing Data Packets data structure to keep track of the data packets that have been received or reconstructed, or are still missing; a Number of Missing Data Packets data structure to record the number of currently missing data packets in each row, column and diagonal; and a Single Missing Data Packets data structure to record the rows, columns and diagonals that currently have exactly one missing data packet.

FIG. 5 is a set of diagrams that show the preferred embodiments of these data structures for the data packets at the receiver. FIG. 5A shows the data packets arranged into an array A (80) of the same dimensions D×L used by the transmitter. In this example D=5, L=11 and S=3. The Xs in the array denote missing packets. The algorithm does not ensure that missing packets in the array A have any defined value, such as zero. Consequently, the value of an entry in the array A for a missing packet must not be used by the algorithm. FIG. 5B shows the preferred embodiment for the Missing Data Packets data structure, i.e., a Boolean array B (82) that records the received and missing data packets, where B[i,j]=1 indicates that the data packet A[i,j] was received or corrected and B[i,j]=0 indicates that it is missing. FIG. 5C shows the preferred embodiment for the Number of Missing Data Packets data structure, i.e., the vectors NR (84), NC (86) and ND (88) of lengths D, L and L that record the numbers of missing data packets in each row, column and diagonal, respectively. FIG. 5D shows the preferred embodiment for the Single Missing Data Packets data structure, i.e., the vectors R1 (90), C1 (92) and D1 (94) of maximum lengths D, L and L that record the indices of the rows, columns and diagonals, respectively, that currently have exactly one missing data packet.

When the FEC algorithm reconstructs a missing packet in row i, column j of the array A, it inserts the reconstructed packet into the array A at that position, so that row i, column j and the corresponding diagonal k no longer contain a missing packet. After recovering the missing packet, the FEC algorithm sets B[i,j]=1 to indicate that the packet is now present, and decrements the values of NR[i], NC[j] and ND[k]. If the value of NR[i], NC[j] or ND[k] now equals one, the FEC algorithm adds row i, diagonal j or column k to R1[i], C1[j] or D1[k].

The FEC algorithm at the receiver also utilizes a data structure to contain the parity packets; a Missing Parity Packets data structure to keep track of the received and missing parity packets; and a Number of Missing Parity Packets data structure to record the numbers of missing parity packets.

Figure 6A:
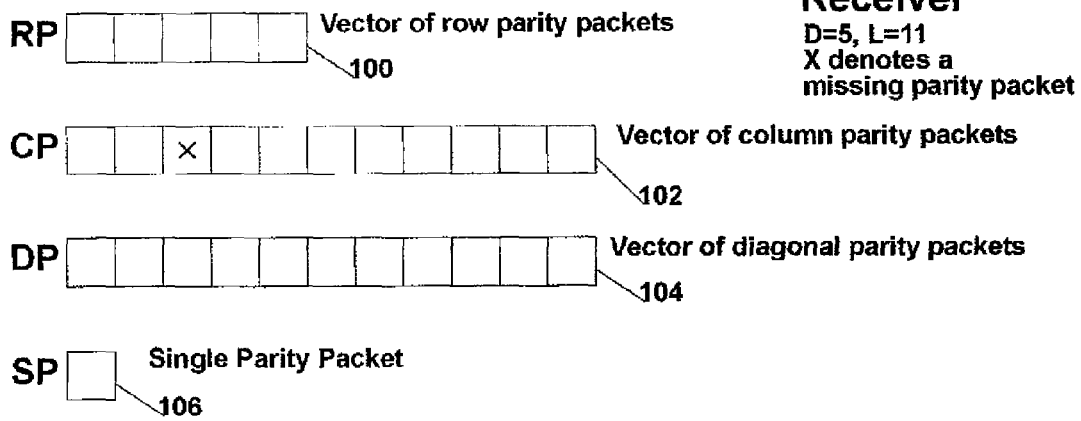
FIG. 6A shows the vectors RP, CP and DP that contain the parity packets for the rows, columns and diagonals, respectively, and the variable SP for the single parity packet.
Figure 6B:
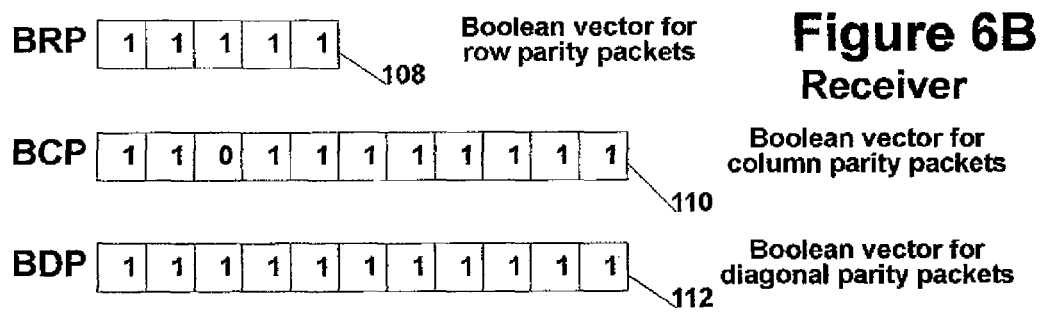
FIG. 6B shows the Missing Parity Packets data structure, which in the preferred embodiment consists of three Boolean vectors BRP, BCP and BDP that record the received and missing parity packets in the rows, columns and diagonals, respectively.
Figure 6C:
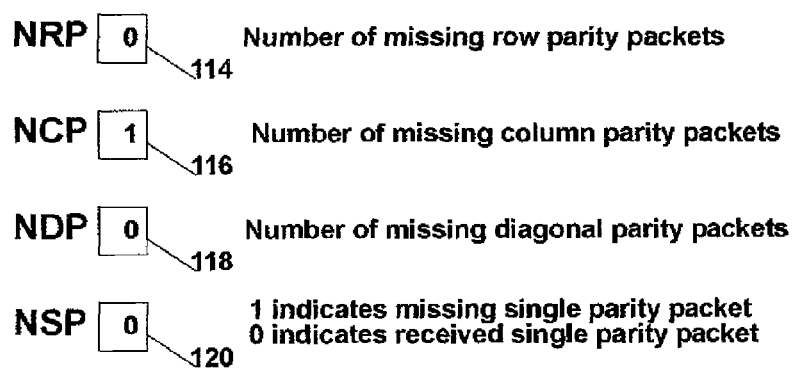
FIG. 6C shows the Number of Missing Parity Packets data structure, which in the preferred embodiment comprises three variables NRP, NCP and NDP that record the numbers of missing row parity packets, column parity packets and diagonal parity packets, respectively, and the variable NSP for the single parity packet.

FIG. 6 is a diagram that shows the preferred embodiments of the data structures for the parity packets at the receiver. FIG. 6A shows the vectors RP (100), CP (102) and DP (104) that contain the parity packets for the rows, columns and diagonals, respectively, and the variable SP (106) for the single parity packet. FIG. 6B shows the preferred embodiment for the Missing Parity Packets data structure, i.e., three Boolean vectors BRP (108), BCP (110) and BDP (112) that record the received and missing parity packets in the rows, columns and diagonals, respectively. FIG. 6C shows the preferred embodiment for the Number of Missing Parity Packets data structure, i.e., three variables NRP (114), NCP (116) and NDP (118) that record the numbers of missing row parity packets, column parity packets and diagonal parity packets, respectively, and the variable NSP (120) which, if set to 1, indicates that the single parity packet is missing and, if set to 0, indicates that the single parity packet is received or reconstructed at the receiver.

Figure 7:
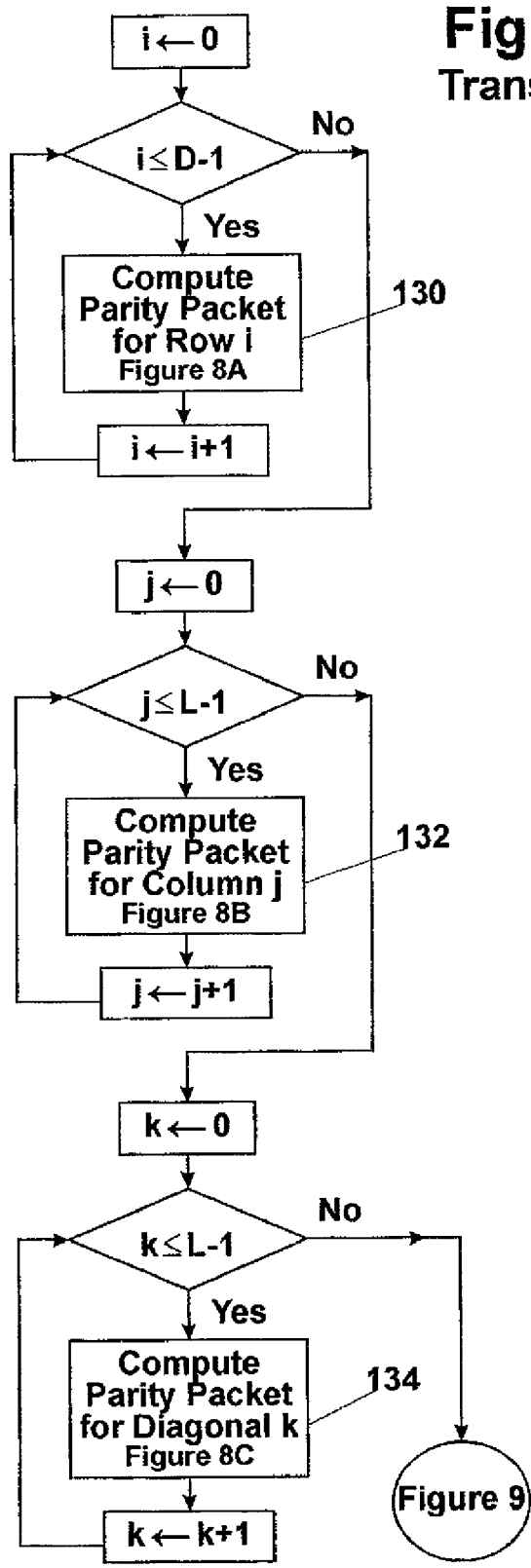
FIG. 7 is a flow diagram that shows, at the transmitter, the details of the computations for the row parity packets, the column parity packets and the diagonal parity packets.

FIG. 7 is a flow diagram that shows, at the transmitter, the computation of the parity packets from the multi-media data packets in the rows (130), the columns (132) and the diagonals (134). These computations are shown in more detail in the flow diagrams in FIG. 8, and are illustrated in the block diagrams in FIG. 3. When the parity packets for the multi-media data packets are constructed, the FEC algorithm can optionally compute a single parity packet from the row parity packets or the column parity packets or the diagonal parity packets, as shown in the flow diagram in FIG. 9 and illustrated in the block diagram in FIG. 4.

FIG. 8 is a set of flow diagrams that provide details of the computations of the parity packet for row i, the parity packet for column j and the parity packet for diagonal k in more detail.

Figure 8A:
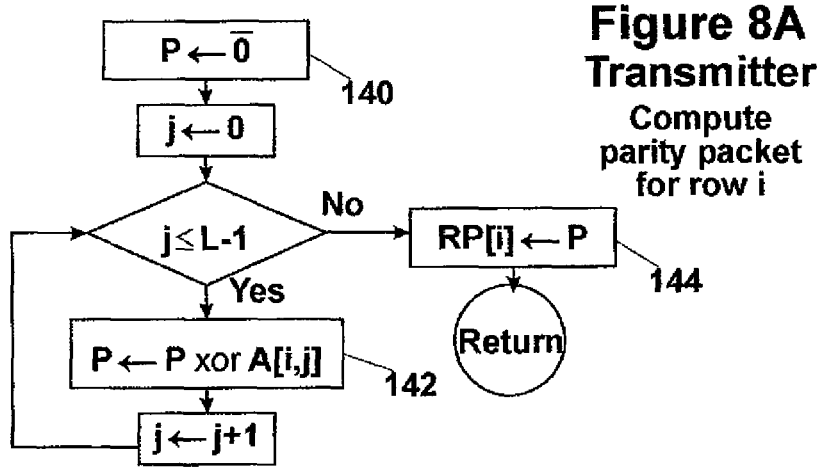
FIG. 8 is a set of flow diagrams that provide details of the computations of the parity packet for row i, the parity packet for column j and the parity packet for diagonal k.

FIG. 8A shows the computation of the parity packet for row i. First, the temporary variable P is zeroed out (140). Then, the parity packet P for row i is formed by XORing into P the multi-media data packet in row i, column j of the array A (142) for each j such that 0 .leq. j .leq. L−1. Then, RP[i] is set to P (144).

Figure 8B:
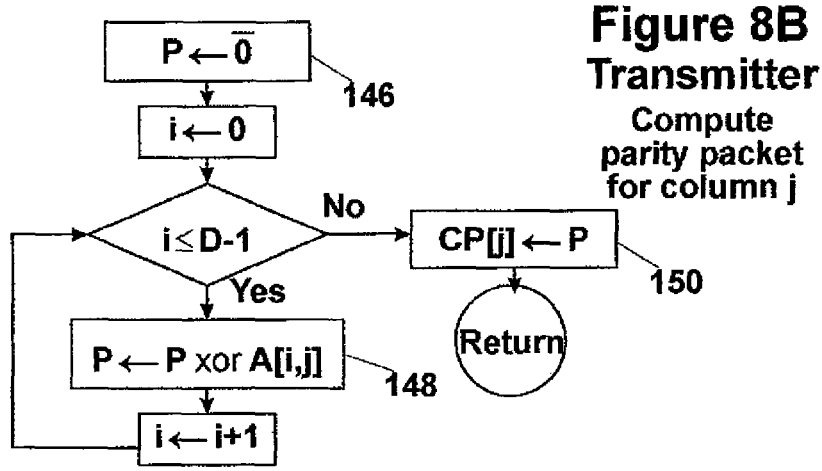

Likewise, FIG. 8B shows the computation of the parity packet for column j. First, the temporary variable P is first zeroed out (146). Then, the parity packet P for column j is formed by XORing into CP[j] the multi-media data packet in row i, column j of the array A (148) for each i such that 0 .leq. i .leq. D−1. Then, CP[j] is set to P (150).

Figure 8C:
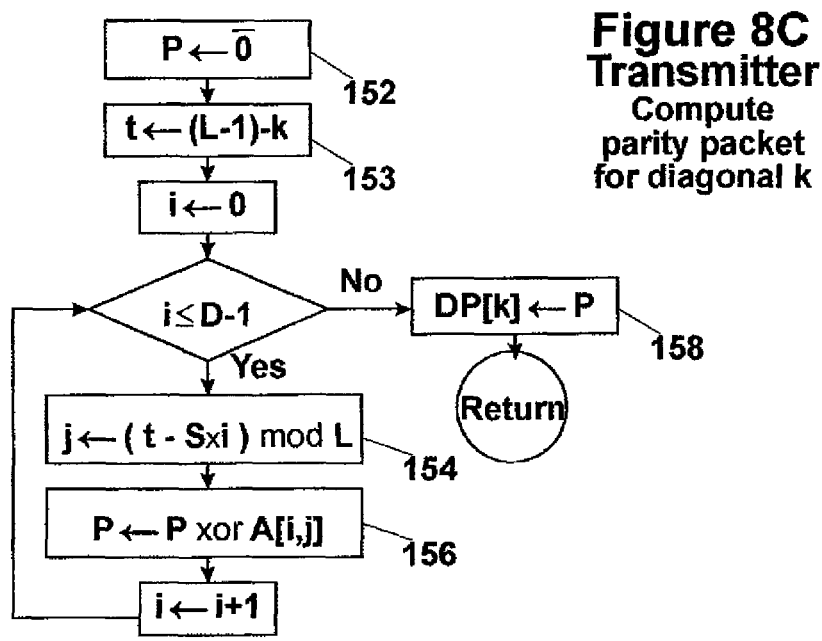

Similarly, FIG. 8C shows the computation of the parity packet for diagonal k. First, the temporary variable P is zeroed out (152). To compute the column in which each packet in diagonal k occurs, first the temporary variable t is set to (L−1)−k (153). For each packet in row i, diagonal k, the column j of that packet is determined by setting j to (t−S×i) mod L (154). Then, the parity packet P for diagonal k is formed by XORing into P the multi-media data packet in row i, column j of the array A (156). Then, DP[k] is set to P (158).

FIG. 9 is a set of flow diagrams that show the optional computation of the single parity packet from either the row parity packets or the column parity packets or the diagonal parity packets at the transmitter or at the receiver.

Figure 9A:
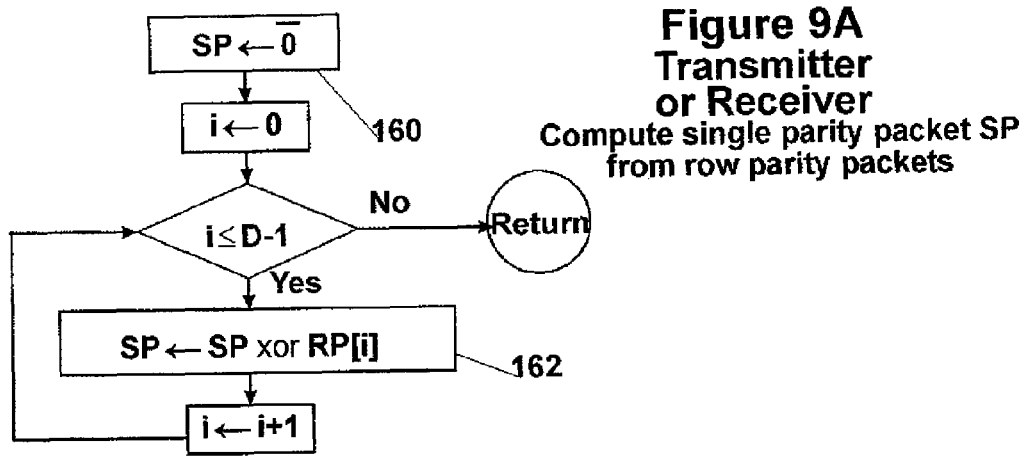
FIG. 9 is a set of flow diagrams that show the optional computation of the single parity packet from either the row parity packets or the column parity packets or the diagonal parity packets at the transmitter or at the receiver.

FIG. 9A shows the computation of the single parity packet from the row parity packets. First, single parity packet variable SP is zeroed out (160). Then, the value of the single parity packet variable SP is formed by XORing into SP the parity packet RP[i] (162) for each i such that 0 .leq. i .leq. D−1.

Figure 9B:
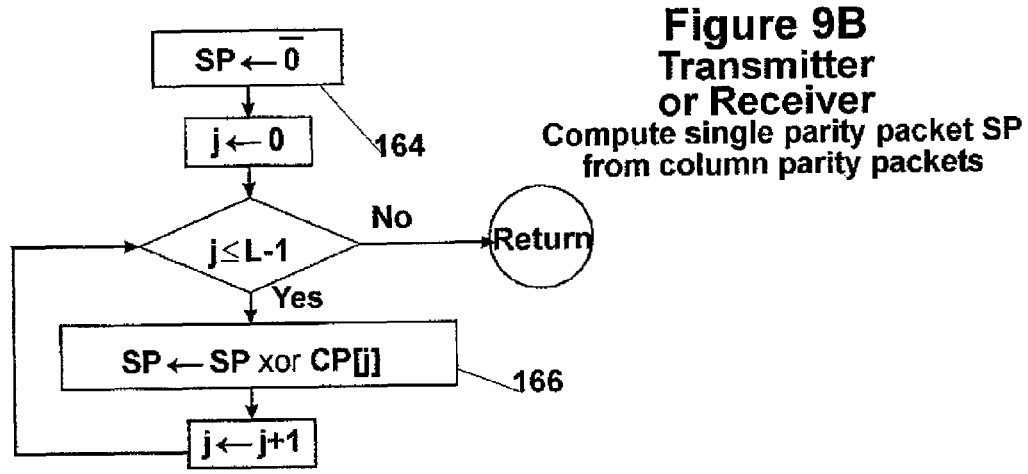

Likewise, FIG. 9B shows the computation of the single parity packet from the column parity packets. First, the single parity packet variable SP is zeroed out (164). Then, the values of the single parity packet variable SP is formed by XORing into SP the parity packet CP[j] (166) for each j such that 0 .leq. j .leq. L−1.

Figure 9C:
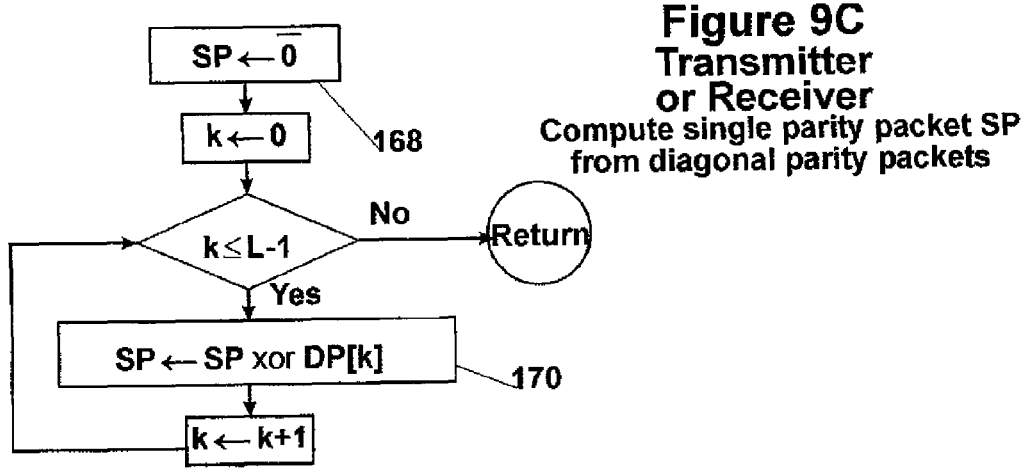

Similarly, FIG. 9C shows the computation of the single parity packet from the diagonal parity packets. First, the single parity packet variable SP is zeroed out (168). Then, the value of the single parity packet variable SP is formed by XORing into SP the parity packet DP[k] (170) for each k such that 0 .leq. k .leq. L−1.

Figure 10:
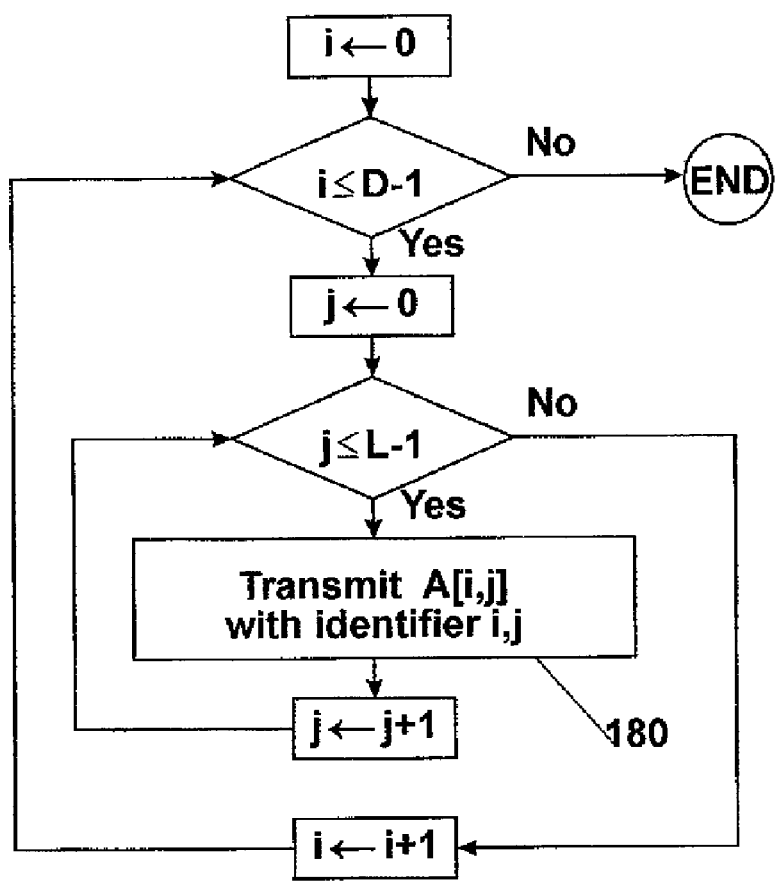
FIG. 10 is a flow diagram that shows, within a nested loop, the transmission of each multi-media data packet A[i,j] with identifier i, j.

FIG. 10 is a flow diagram that shows, within a nested loop, the transmission of each multi-media data packet A[i,j] with identifier i, j (180).

Figure 11:
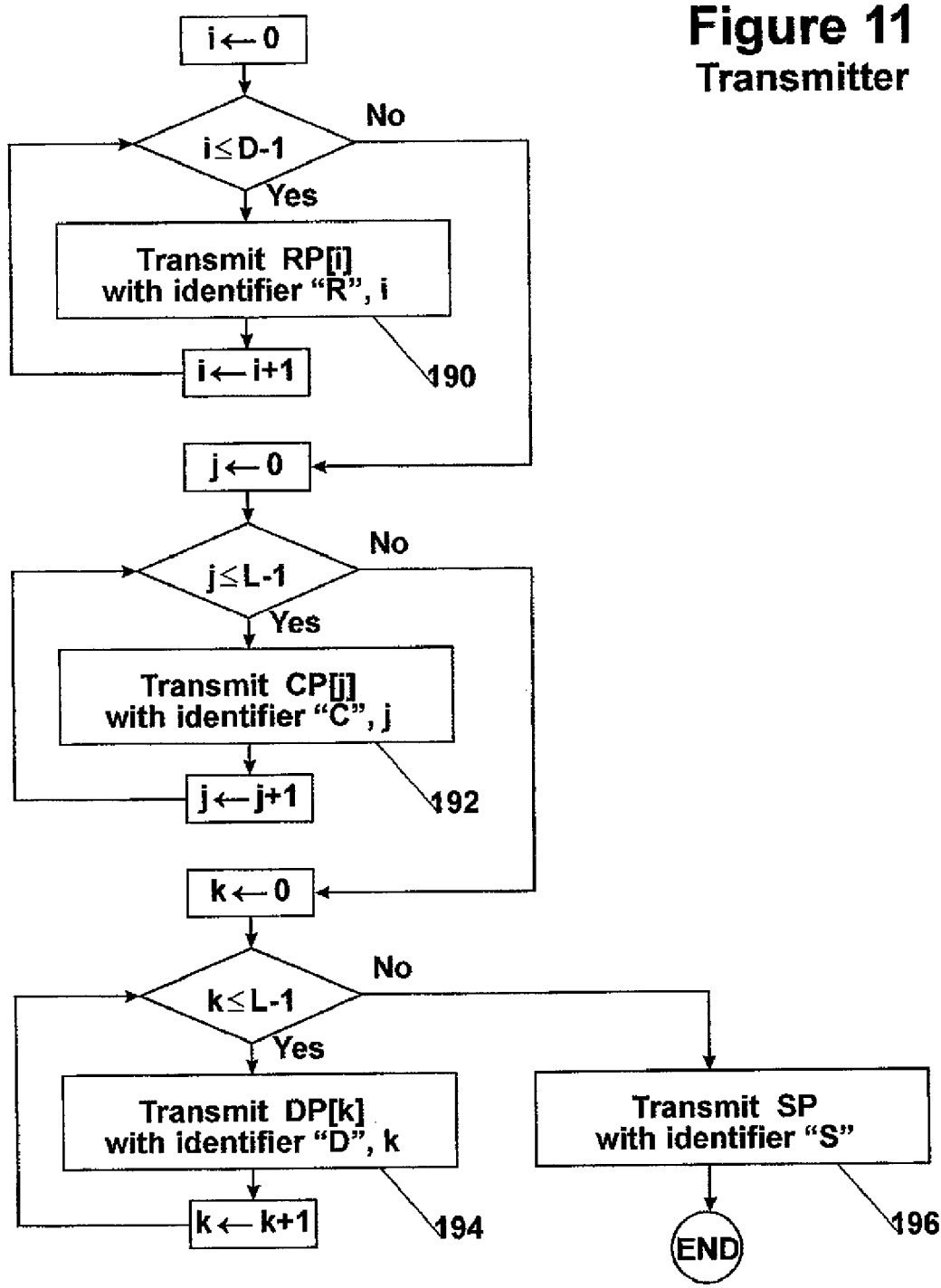
FIG. 11 is a flow diagram that shows, within three separate loops, the transmission of each row parity packet RP[i] with identifier "R", i, each column parity packet CP[j] with identifier "C", j and each diagonal parity packet DP[k] with identifier "D", k followed by the transmission of the single parity packet SP with identifier "S".

FIG. 11 is a flow diagram that shows, within three separate loops, the transmission of each row parity packet RP[i] with identifier "R", i (190), each column parity packet CP[j] with identifier "C", j (192) and each diagonal parity packet DP[k] with identifier "D", k (194) followed by the transmission of the single parity packet SP with identifier "S" (196).

FIG. 12 is a set of flow diagrams for the initialization of the data structures for the multi-media data packets and the reception of the multi-media data packets at the receiver.

Figure 12A:
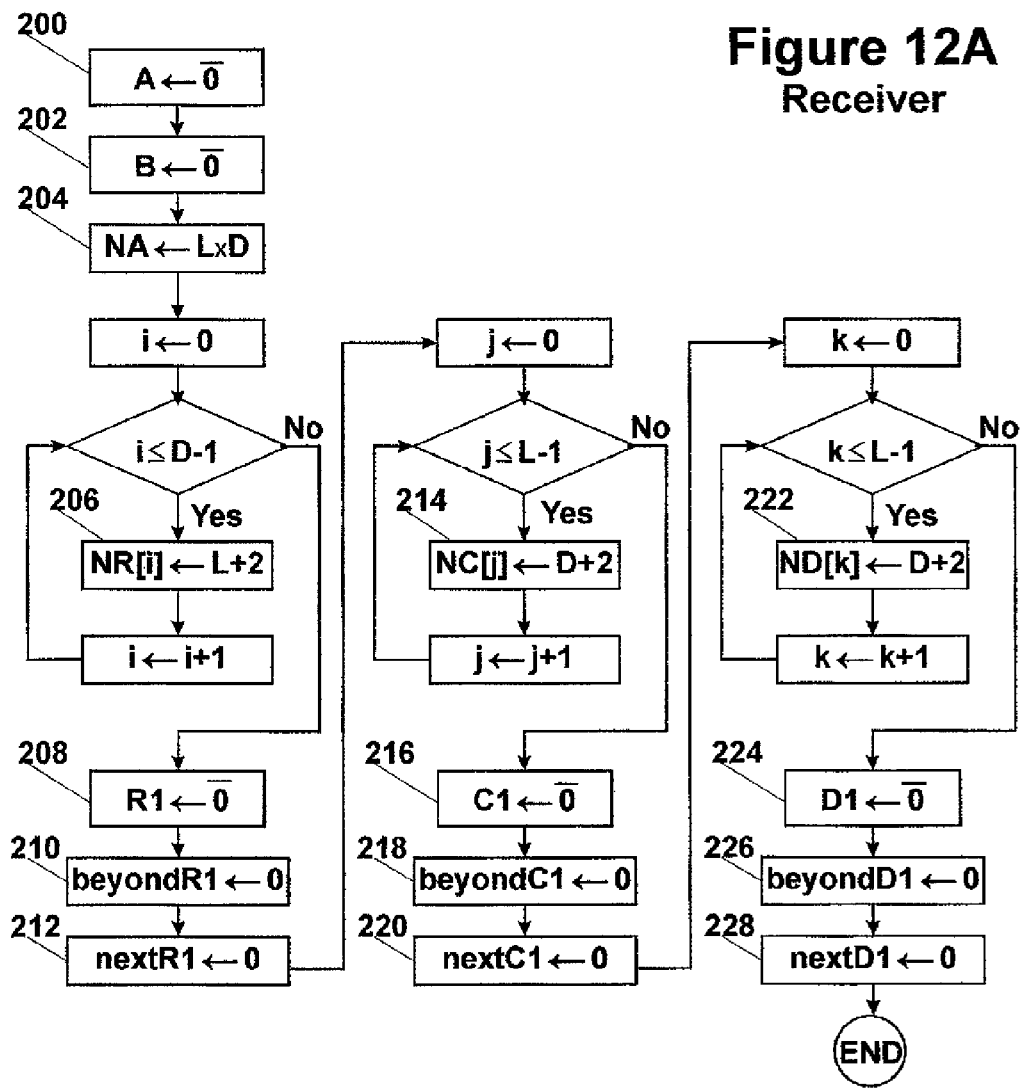
FIG. 12 is a set of flow diagrams that show the initialization of the arrays, vectors and variables in preparation for the reception of the multi-media data packets at the receiver using the array A, the Boolean array B, the vectors NR, NC and ND, and the vectors R1, C1 and D1. It also shows the reception of a data packet and the insertion of the data packet into the array A.

FIG. 12A is a flow diagram that shows the initialization of the arrays, vectors and variables in preparation for reception of the multi-media data packets. First, the algorithm zeroes out the array A that is to contain the multi-media data packets (200) and the Boolean array B that records the received and missing multi-media data packets (202) and initializes the variable NA that records the number of missing multi-media data packets in the array A to D×L (204). Next, for the rows, the algorithm sets, within a loop, each of the entries of the vector NR to L+2 (206). Then, it zeros out R1 (208), sets beyondR1 to 0 (210) and sets nextR1 to 0 (212). Likewise, for the columns, the algorithm sets, within a loop, each of the entries of the vector NC to D+2 (214). Then, it zeros out C1 (216), sets beyondC1 to 0 (218) and sets nextC1 to 0 (220). Similarly, for the diagonals, the algorithm sets, within a loop, each of the entries of the vector ND to D+2 (222). Then, it zeros out D1 (224), sets beyondD1 to 0 (226) and sets nextD1 to 0 (228).

Figure 15A:
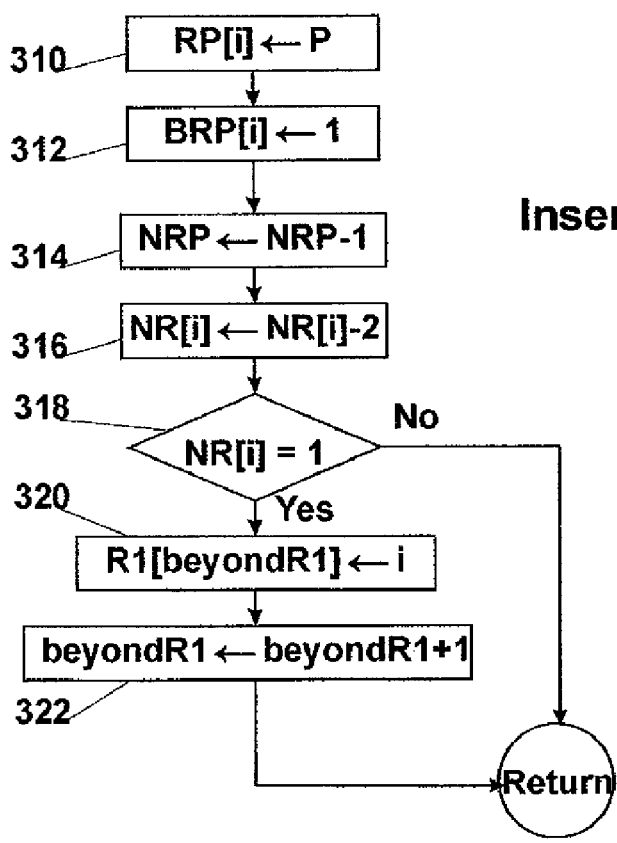
FIG. 15 is a set of flow diagrams that show the insertion of parity packets into the vectors RP, CP and DP, and the variable SP, when receiving parity packets or correcting (recovering) parity packets, and the associated updates to other data structures at the receiver.

The value L+2 to which the entries in the vector NR are initialized correspond to the L data packets in a row plus one for the row parity packet plus one. When a data packet in this row is received, the value of the corresponding entry in NR is reduced by one. When the row parity packet is received, the value of the corresponding entry in NR is reduced by two as shown in FIG. 15A, which ensures that the algorithm does not attempt error correction when the row parity packet is not present. The rationale is similar for the value D+2 to which the entries in the vector NC are initialized and the value D+2 to which entries in the vector ND are initialized.

Figure 12B:
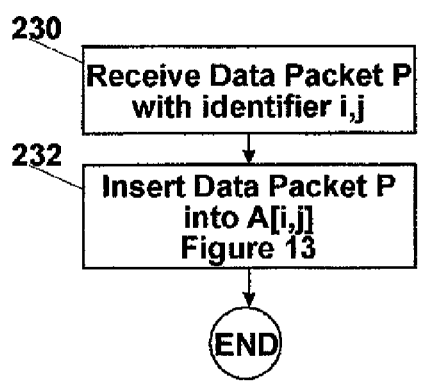
Figure 13:
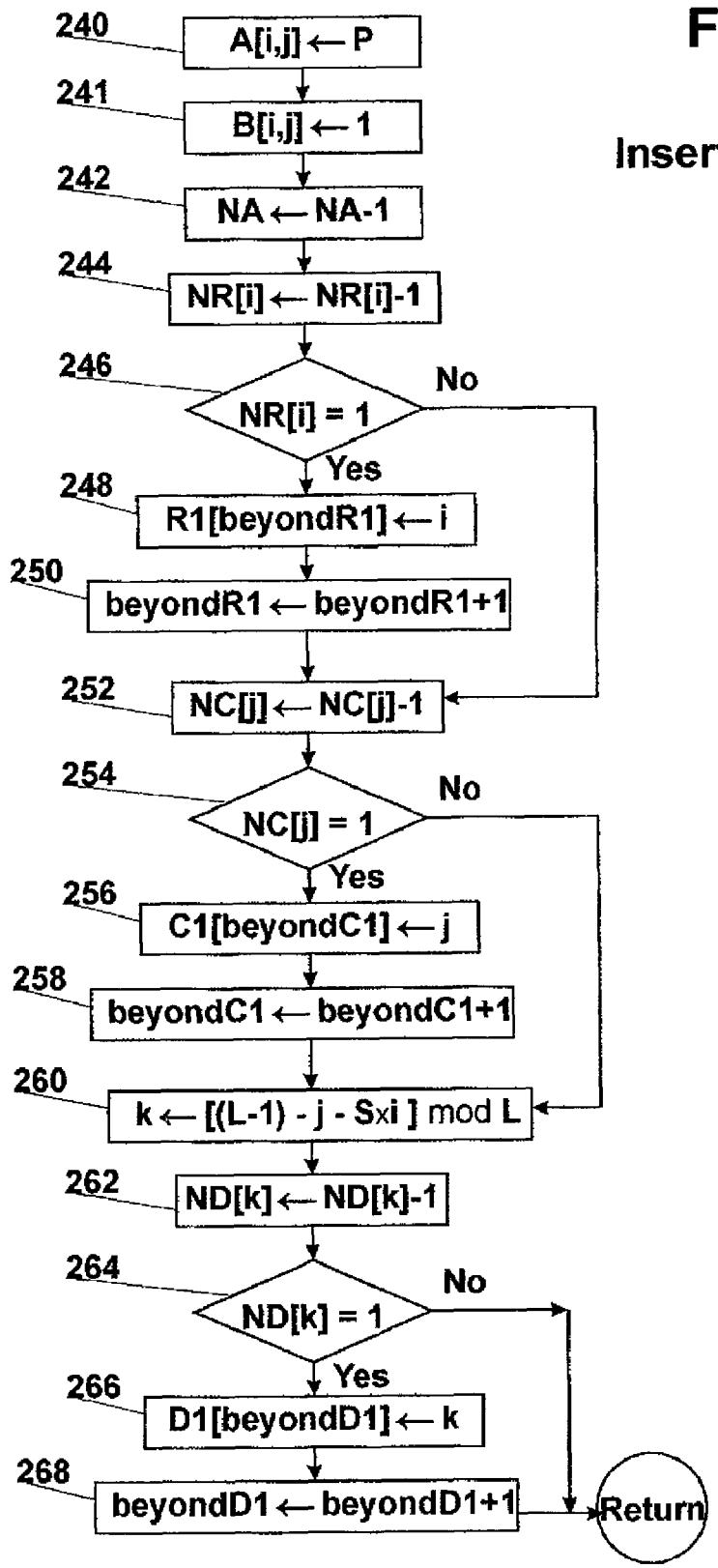
FIG. 13 is a flow diagram that shows the insertion of a multi-media data packet into the array A, either a packet that has been received or a packet that has been corrected (reconstructed).

FIG. 12B is a flow diagram that shows the reception (230) of the multi-media data packets and the insertion of these packets into the array A (232), as shown in FIG. 13.

FIG. 13 is a flow diagram that shows the insertion of a multi-media data packet into the array A, either a packet that has been received or a packet that has been corrected (reconstructed). First, the algorithm sets A[i,j] to P (240), sets B[i,j] to 1 (241) and decrements NA (242). Then, the algorithm decrements NR[i] (244). Next, the algorithm checks whether NR[i] equals 1 (246). If so, the algorithm sets R1[beyondR1] to i (248) and increments beyondR1 (250). Then, the algorithm decrements NC[j] (252). Next, the algorithm checks whether NC[j] equals 1 (254). If so, the algorithm sets C1[beyondC1] to j (256) and increments beyondC1 (258). Then, the algorithm sets k to [(L−1)−j−S×i] mod L (260) and decrements ND[k] (262). Next, the algorithm checks whether ND[k] equals 1 (264). If so, the algorithm sets D1[beyondD1] to k (266) and increments beyondD1 (268).

FIG. 14 is a set of flow diagrams for the initialization of the data structures for the parity packets and reception of the parity packets at the receiver.

FIG. 14A is a flow diagram that shows the initialization of the vectors and variables in preparation for reception of the parity packets. First, for the row parity packets, the algorithm zeroes out the vector RP that is to contain the row parity packets (270), zeroes out the Boolean vector BRP that records the received and missing row parity packets (272), and sets the variable NRP that records the number of missing row parity packets to D (274). Likewise, for the column parity packets, the algorithm zeroes out the vector CP that is to contain the column parity packets (276), zeroes out the Boolean vector BCP that records the received and missing column parity packets (278), and sets the variable NCP that records the number of missing column parity packets to L (280). Similarly, for the diagonal parity packets, the algorithm zeroes out the vector DP that is to contain the diagonal parity packets (282), zeroes out the Boolean vector BDP that records the received and missing diagonal parity packets (284), and sets the variable NDP that records the number of missing diagonal parity packets to L (286). Finally, the algorithm initializes NSP to 1 to indicate that the single parity packet is initially missing (288).

FIG. 14B is a flow diagram that shows the reception of the row parity packets, the column parity packets and the diagonal parity packets and the insertion of those packets into the vectors RP, CP and DP, respectively, and also the reception of the single parity packet and the insertion of that packet into the variable SP. In particular, the diagram shows the reception of a parity packet P with identifier m, n (290). First, the algorithm checks whether m="R" (292). If so, the algorithm inserts the parity packet P into RP[n] (294), as shown in more detail in FIG. 15A. If not, the algorithm checks whether m="C" (296). If so, the algorithm inserts the parity packet P into CP[n] (298), as shown in more detail in FIG. 15B. If not, the algorithm checks whether m="D" (300). If so, the algorithm inserts the parity packet P into DP[n] (302), as shown in more detail in FIG. 15C. If not, the algorithm checks whether m="S" (304). If so, the algorithm inserts P into SP (306) and sets NSP to 0 (308).

FIG. 15 is a set of flow diagrams that show the insertion of parity packets into the vectors RP, CP and DP, when receiving parity packets or correcting (recovering) parity packets, and the associated updates to other data structures at the receiver.

FIG. 15A shows the insertion of a row parity packet P into RP[i]. First, the algorithm inserts P into RP[i] (310) and sets BRP[i] to 1 (312). Then, the algorithm decrements NRP (314) and sets NR[i] to NR[i]−2 (316). Next, the algorithm checks whether now NR[i] equals 1 (318). If so, the algorithm sets R1[beyondR1] to i (320) and increments beyondR1 (322).

Figure 15B:
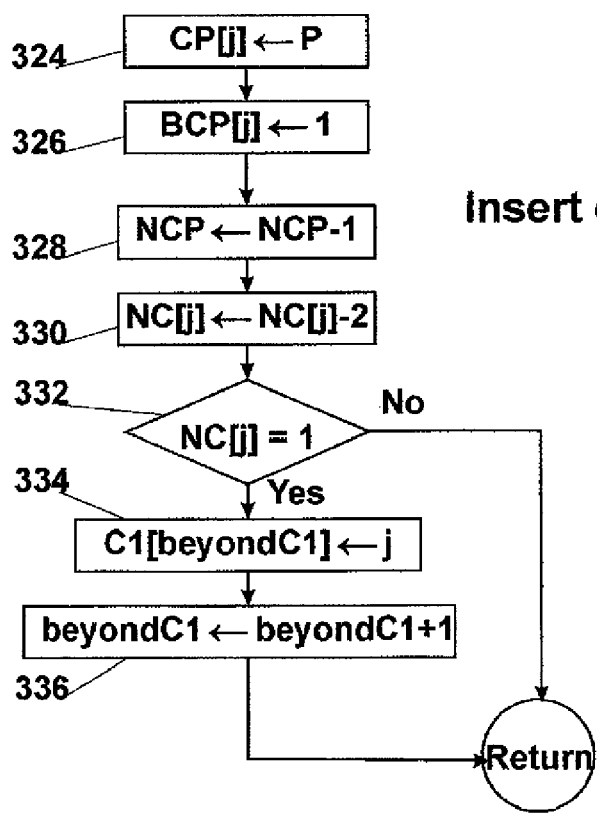

FIG. 15B shows the insertion of a column parity packet P into CP[j]. First, the algorithm inserts P into CP[j] (324) and sets BCP[j] to 1 (326). Then, the algorithm decrements NCP (328) and sets NC[j] to NC[j]−2 (330). Next, the algorithm checks whether now NC[j] equals 1 (332). If so, the algorithm sets C1[beyondC1] to i (334) and increments beyondC1 (336).

Figure 15C:
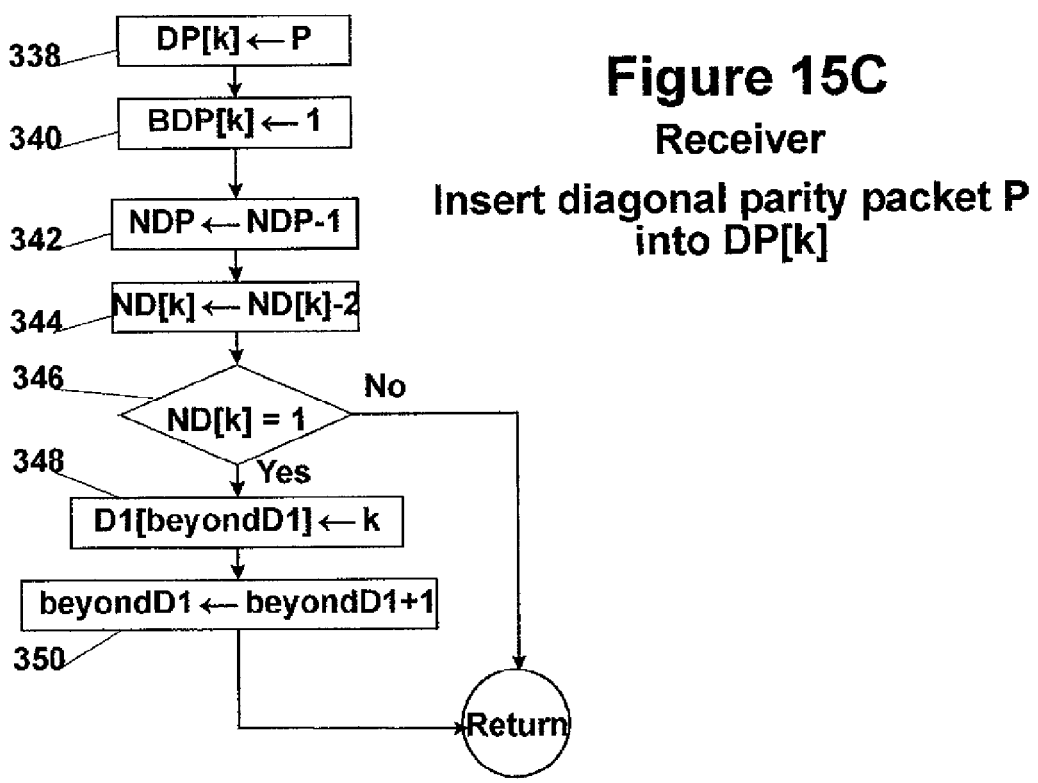

FIG. 15C shows the insertion of a diagonal parity packet P into DP[k]. First, the algorithm inserts P into DP[k] (338) and sets BDP[k] to 1 (340). Then, the algorithm decrements NDP (342) and sets ND[k] to ND[k]−2 (344). Next, the algorithm checks whether now ND[k] equals 1 (346). If so, the algorithm sets D1[beyondD1] to k (348) and increments beyondD1 (350).

Figure 16:
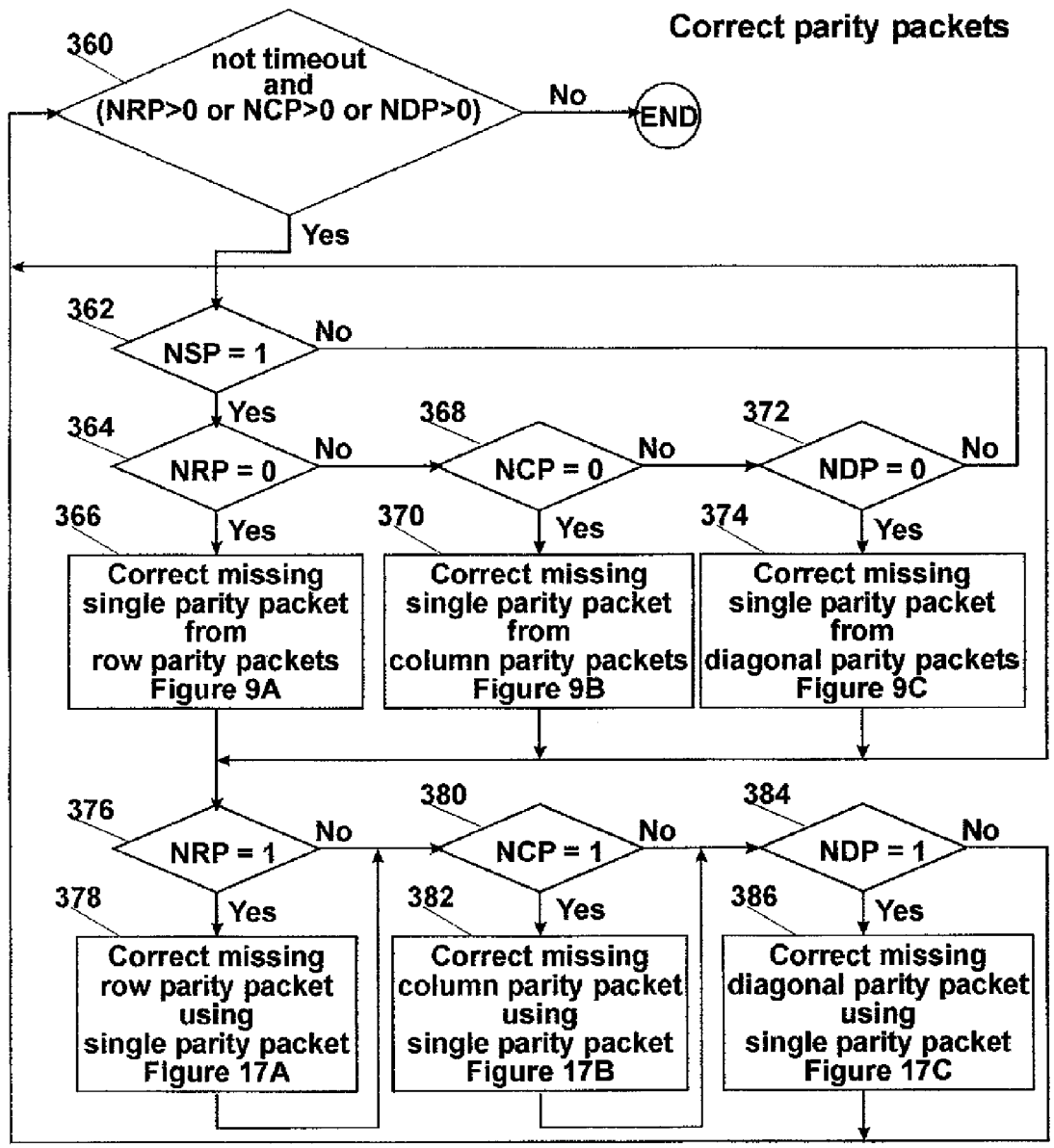
FIG. 16 is a flow diagram that shows the correction of the missing extra single parity packet, either because the transmitter did not calculate and transmit the extra single parity packet or because the network lost or corrupted the extra single parity packet. It also shows the correction of a missing row parity packet, column parity packet or diagonal parity packet.

FIG. 16 is a flow diagram that shows the correction of a missing extra single parity packet, either because the transmitter did not calculate and transmit the extra single parity packet or because the network lost or corrupted the extra single parity packet. It also shows the correction of a missing row parity packet, column parity packet or diagonal parity packet. Within a loop terminated by the condition not timeout and (NRP>0 or NCP>0 or NDP>0) (360), the algorithm first checks whether NSP=1 (362). If NSP=1, the algorithm checks whether NRP=0 (364). If so, the algorithm calculates (corrects) the missing single parity packet from the row parity packets (366), as shown in FIG. 9A; otherwise, it checks whether NCP=0 (368). If so, the algorithm calculates (corrects) the missing single parity packet from the column parity packets (370), as shown in FIG. 9B; otherwise, it checks whether NDP=0 (372). If so, the algorithm calculates (corrects) the missing single parity packet from the diagonal parity packets (374), as shown in FIG. 9C; otherwise, the algorithm continues at the start of the loop anticipating that the timeout has occurred or another parity packet has arrived. Otherwise, if NSP=0, the algorithm checks whether NRP=1 (376). If so, the algorithm corrects the missing row parity packet (378), as shown in more detail in FIG. 17A. Then, the algorithm checks whether NCP=1 (380). If so, the algorithm corrects the missing column parity packet (382), as shown in more detail in FIG. 17B. Then, the algorithm checks whether NDP=1 (384). If so, the algorithm corrects the missing diagonal parity packet (386), as shown in more detail in FIG. 17C. Then, the algorithm continues back through the loop until the termination condition is reached.

FIG. 17 is a set of flow diagrams that show the correction of a missing parity packet using the single parity packet.

Figure 17A:
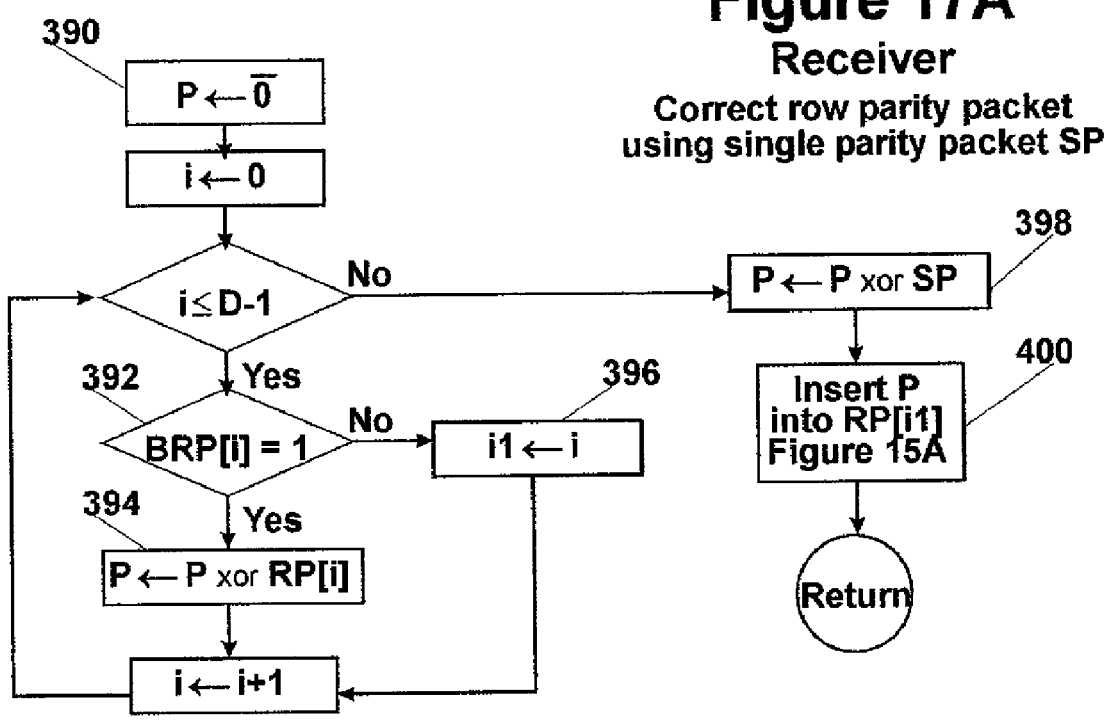
FIG. 17 is a set of flow diagrams that show the correction of a missing parity packet using the single parity packet.

FIG. 17A shows the correction of a missing row parity packet. First, the algorithm zeroes out P (390). Then, within a loop, for 0 .leq. i .leq. D−1, the algorithm checks whether BRP[i]=1 (392). If so, it XORs RP[i] into P (394); otherwise, it sets i1 to i (396). When it finishes the loop, the algorithm XORs SP into P (398) and then inserts P into RP[i1] (400), as shown in more detail in FIG. 15A.

Figure 17B:
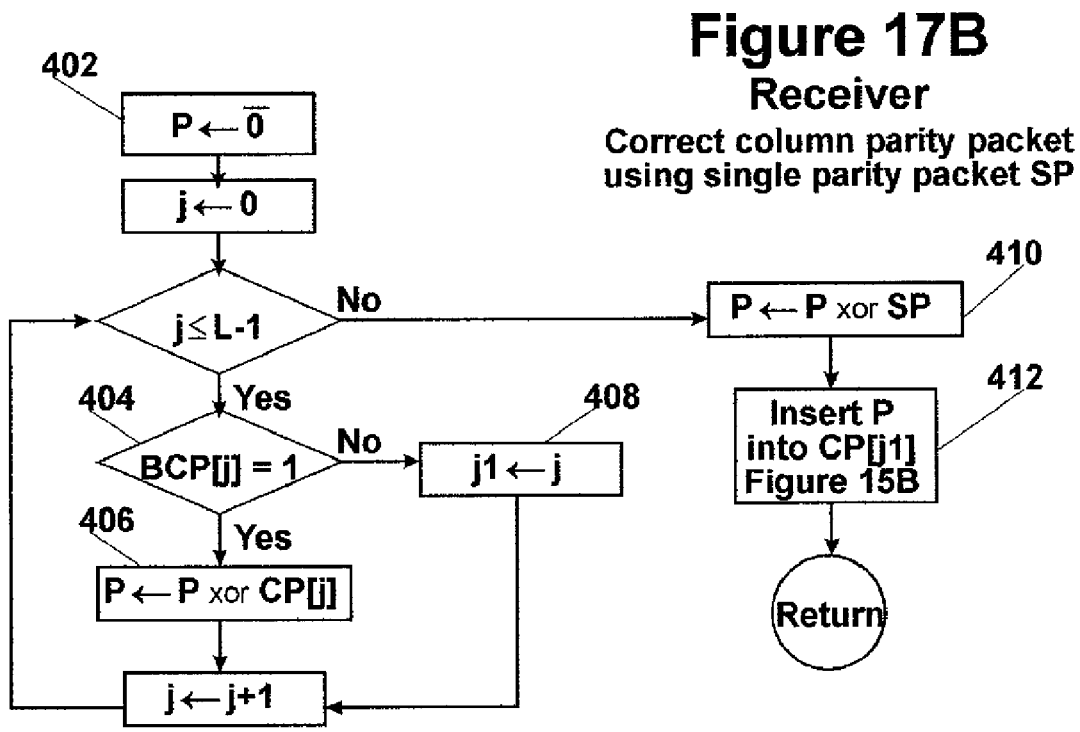

FIG. 17B shows the correction of a missing column parity packet. First, the algorithm zeroes out P (402). Then, within a loop, for 0 .leq. j .leq. L−1, the algorithm checks whether BRP[j]=1 (404). If so, it XORs CP[j] into P (406); otherwise, it sets j1 to j (408). When it finishes the loop, the algorithm XORs SP into P (410) and then inserts P into CP[j1] (412), as shown in more detail in FIG. 15B.

Figure 17C:
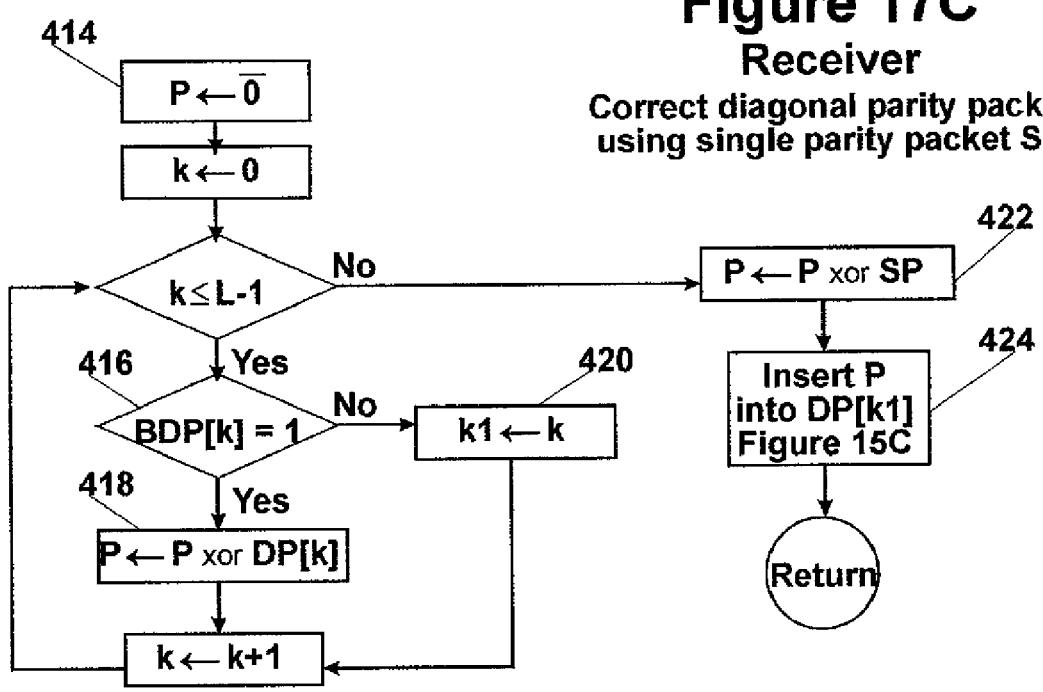

FIG. 17C shows the correction of a missing diagonal parity packet. First, the algorithm zeroes out P (414). Then, within a loop, for 0 .leq. k .leq. L−1, the algorithm checks whether BDP[k]=1 (416). If so, it XORs DP[k] into P (418); otherwise, it sets k1 to k (420). When it finishes the loop, the algorithm XORs SP into P (422) and then inserts P into DP[k1] (424), as shown in more detail in FIG. 15C.

Figure 18:
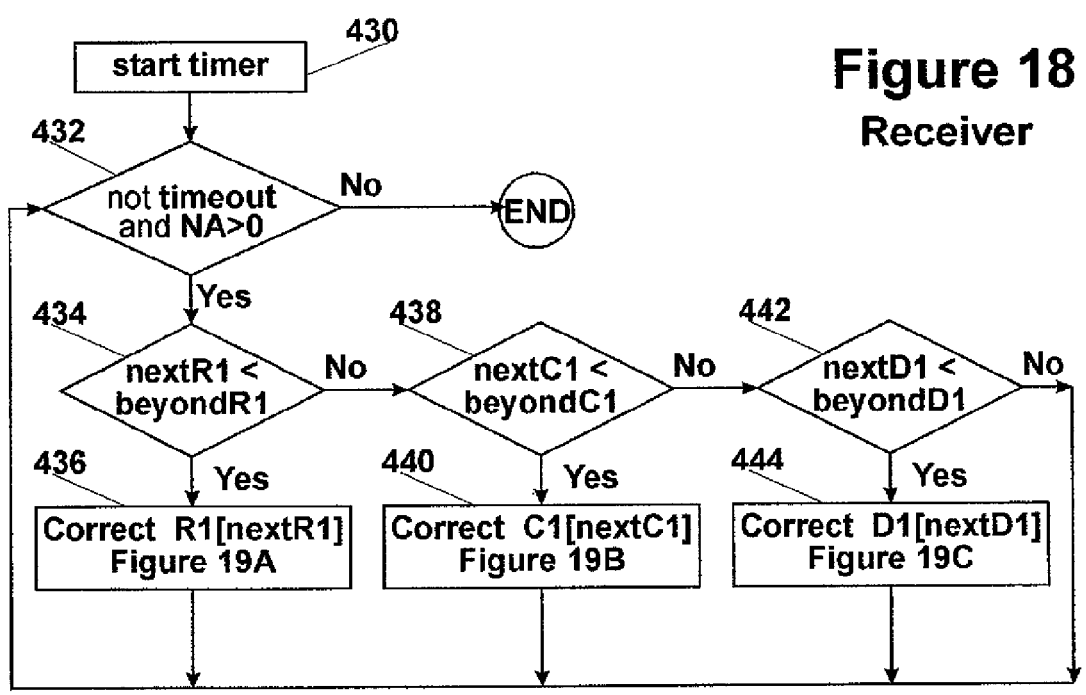
FIG. 18 is a flow diagram that shows the main loop of the algorithm at the receiver that corrects missing multi-media data packets in the rows, columns and diagonals that contain exactly one missing packet.
Figure 19A:
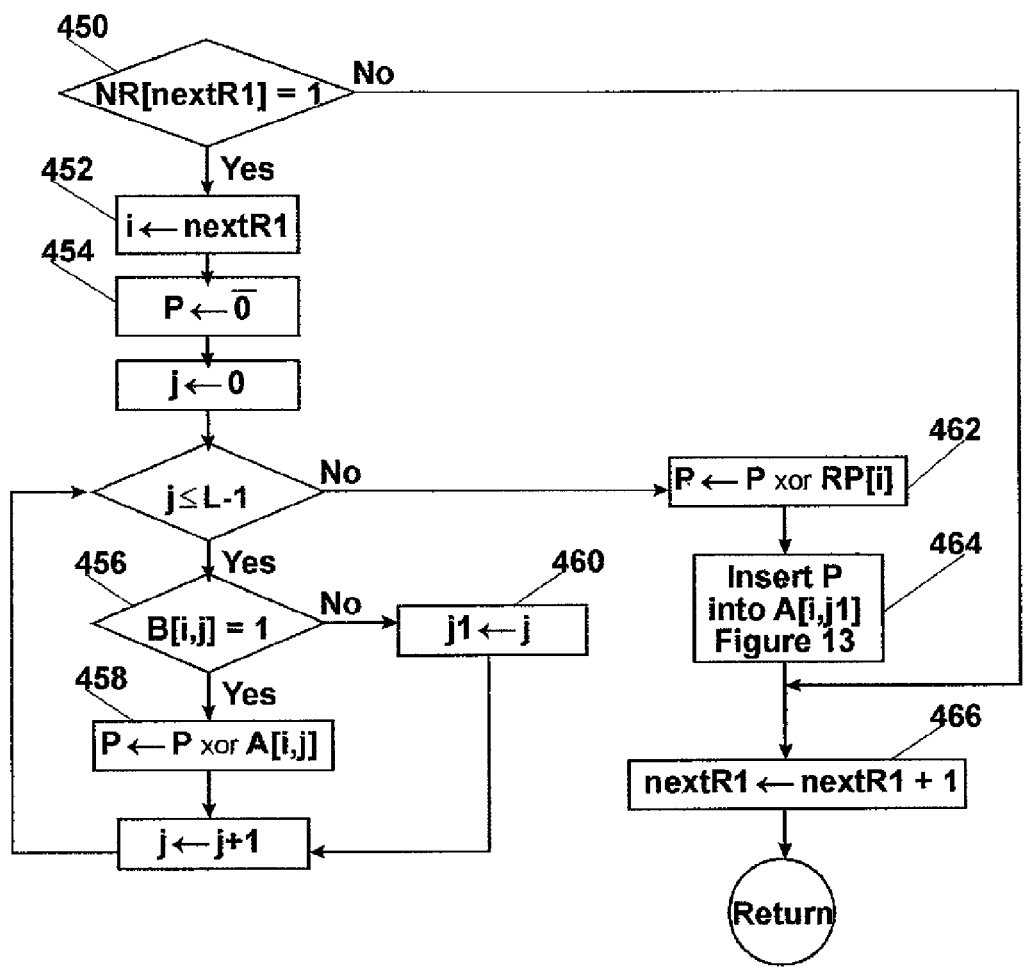
FIG. 19 is a set of flow diagrams that provide details of the correction of missing multi-media data packets in the rows, columns and diagonals that contain exactly one missing packet at the receiver.
Figure 19B:
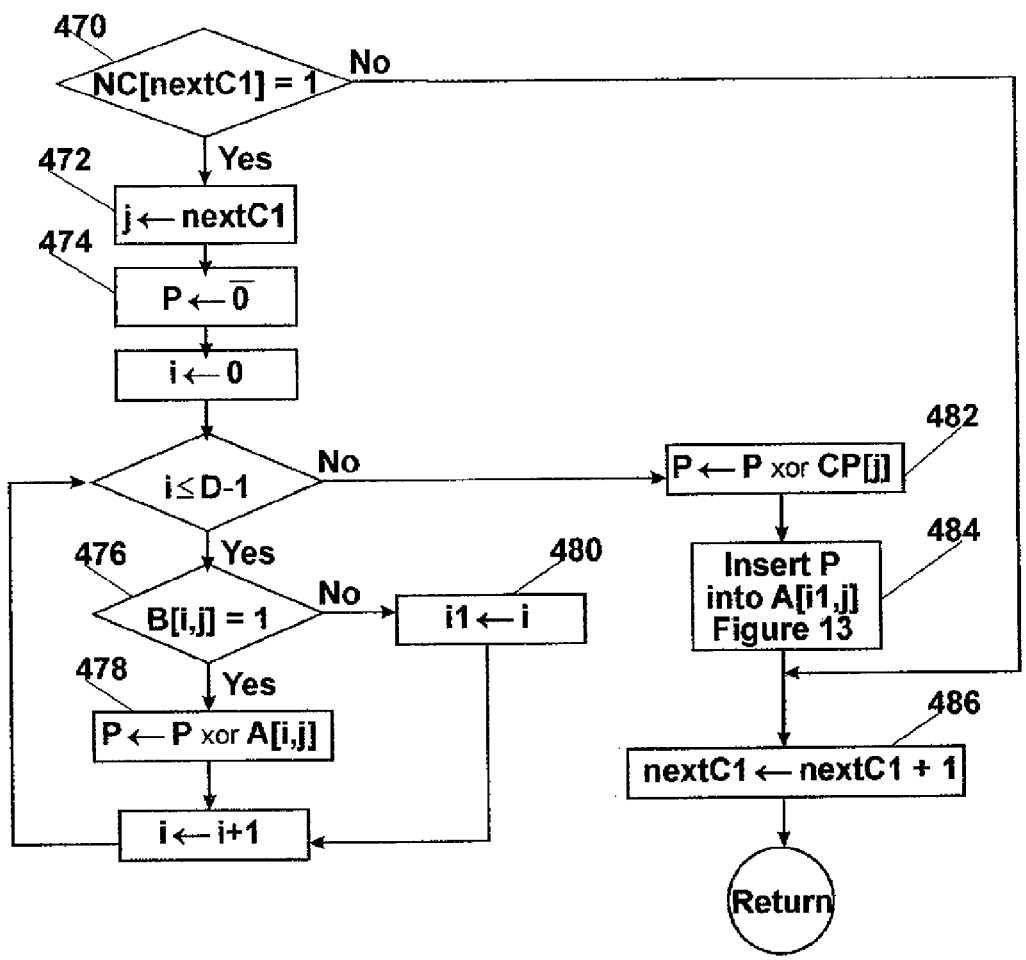
Figure 19C:
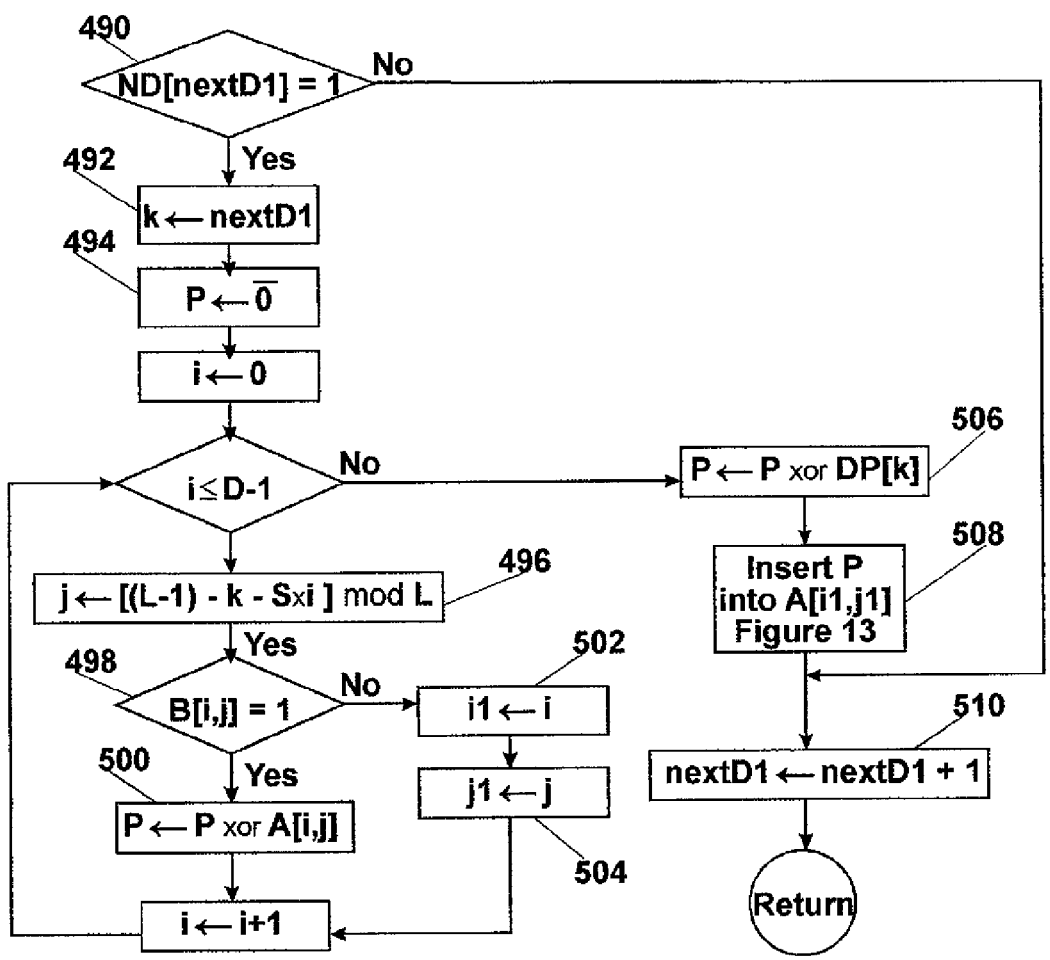

FIG. 18 is a flow diagram that shows the main loop of the algorithm at the receiver that corrects missing multi-media data packets in the rows, columns and diagonals of the array A that contain exactly one missing packet. First, the timer is started (430). Next, within a loop, the algorithm checks the condition not timeout and NA>0 (432). If this condition evaluates to TRUE, the algorithm checks whether nextR1 .lt. beyondR1 (434). If nextR1 .lt. beyondR1, the algorithm corrects the single missing packet in the row R1[nextR1] (436), as shown in FIG. 19A, and comes back through the loop. Otherwise, the algorithm checks whether nextC1 .lt. beyondC1 (438). If nextC1 .lt. beyondC1, the algorithm corrects the single missing packet in the column C1[nextC1] (440), as shown in FIG. 19B, and comes back through the loop. Otherwise, the algorithm checks whether nextD1 .lt. beyondD1 (442), as shown in FIG. 19C. If nextD1 .lt. beyondD1, the algorithm corrects the single missing packet in the diagonal D1[nextD1] (444), as shown in FIG. 19C, and comes back through the loop.

FIG. 19 is a set of flow diagrams that provide details of the correction of missing packets in the rows, columns and diagonals that contain exactly one missing multi-media data packet at the receiver.

FIG. 19A shows the correction of exactly one missing multi-media data packet in a row at the receiver. First, the algorithm checks whether there is still exactly one missing packet in row nextR1 (450). If not, it increments nextR1 (466). Otherwise, it sets i equal to nextR1 (452) and zeros out P (454). Then, within a loop, for each packet j in row i, the algorithm checks whether B[i,j]=1 (456). If B[i,j]=1, the algorithm XORs A[i,j] into P (458). Otherwise, the algorithm sets j1 equal to j (460). When it finishes the loop, the algorithm XORs RP[i] into P (462). Then, the algorithm inserts P into A[i,j1] (464), as shown in FIG. 13. Then, the algorithm increments nextR1 (466).

FIG. 19B shows the correction of exactly one missing multi-media data packet in a column at the receiver. First, the algorithm checks whether there is still exactly one missing packet in column nextC1 (470). If not, it increments nextC1 (486). Otherwise, it sets j equal to nextC1 (472) and zeros out P (474). Then, within a loop, for each packet i in column j, the algorithm checks whether B[i,j]=1 (476). If B[i,j]=1, the algorithm XORs A[i,j] into P (478). Otherwise, the algorithm sets i1 equal to i (480). When it finishes the loop, the algorithm XORs CP[j] into P (482). Then, the algorithm inserts P into A[i1,j] (484), as shown in FIG. 13. Then, the algorithm increments nextC1 (486).

FIG. 19C shows the correction of exactly one missing multi-media data packet in a diagonal at the receiver. First, the algorithm checks whether there is still exactly one missing packet in diagonal nextD1 (490). If not, it increments nextD1 (510). Otherwise, it sets k equal to nextD1 (492) and zeros out P (494). Then, within a loop, for each packet i in diagonal k, the algorithm first sets j equal to [(L−1)−k−S×i] mod L (496) and then checks whether B[i,j]=1 (498). If B[i,j]=1, the algorithm XORs A[i,j] into P (500). Otherwise, the algorithm sets i1 equal to i (502) and j1 equal to j (504). When it finishes the loop, the algorithm XORs DP[k] into P (506). Then, the algorithm insert P into A[i1,j1] (508), as shown in FIG. 13. Then, the algorithm increments nextD1 (510).

Figure 20A:
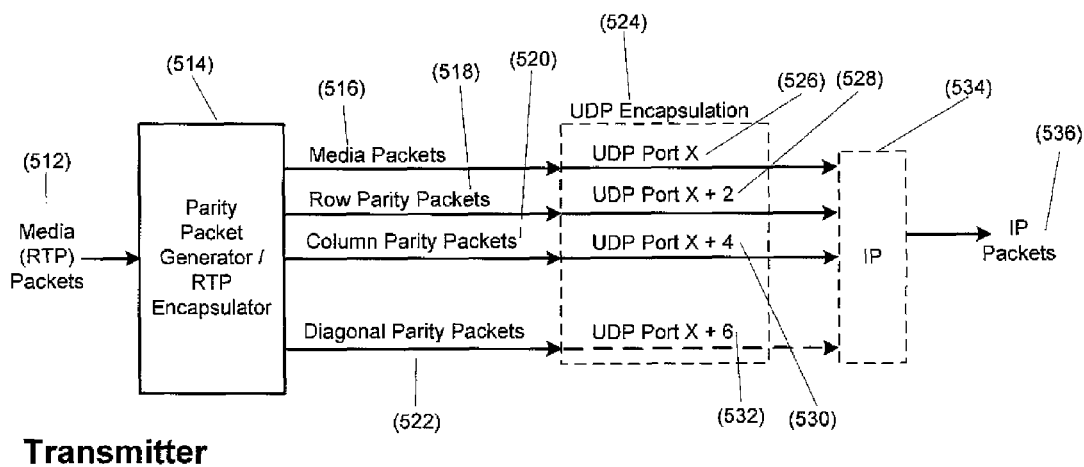
FIG. 20 is a set of diagrams that show a method of communicating that allows backwards compatibility with existing standards.

FIG. 20A shows an implementation of transmitting media and parity packets that is compatible with existing standards. The media packets are fed to the parity packet generator/RTP encapsulator (512). The parity packet generator/RTP encapsulator generates four streams of RTP packets: the media packets (516), the row parity packets (518), the column parity packets (520), and the diagonal parity packets (522). These four data streams are then fed to the UDP encapsulation block (524). The media packets are assigned a destination address of X (526). The row parity packets are assigned a destination address of X+2 (528). The column parity packets are assigned a destination address of X+4 (530). The diagonal parity packets are assigned a destination address of X+6 (532). The four streams of packets are then fed to the IP encapsulation block (534) and transmitted as IP packets (536).

Figure 20B:
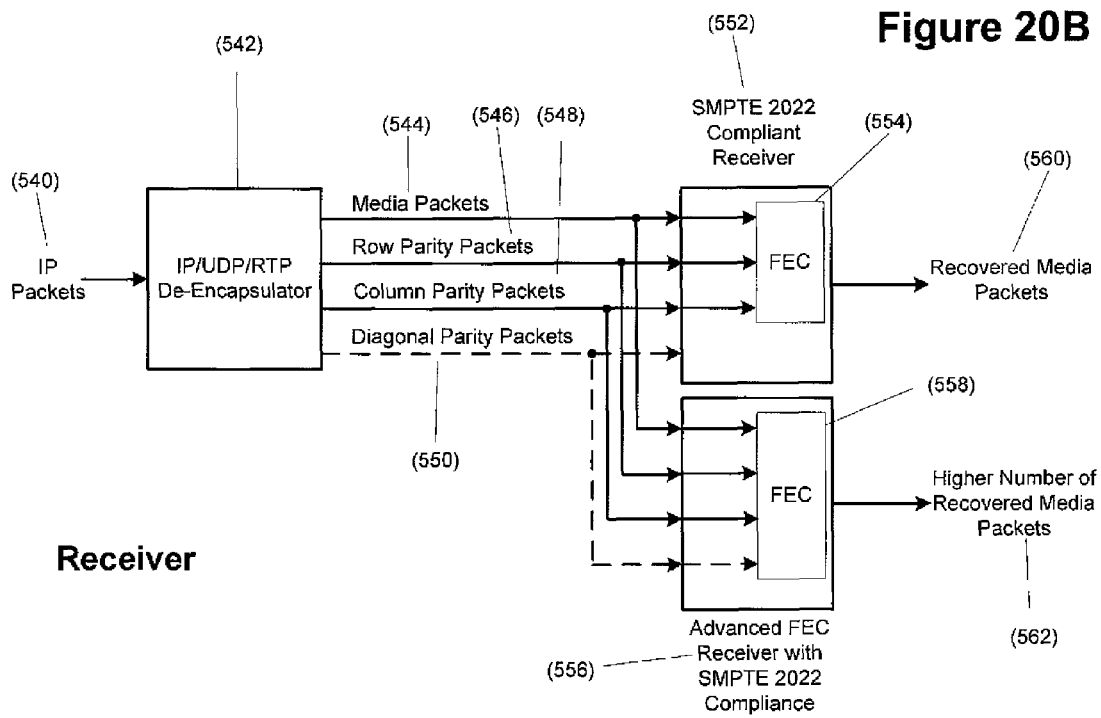

FIG. 20B shows an implementation of receiving media and parity packets that is compatible with existing standards. The IP packets (540) are fed to the IP/UDP/RTP de-encapsulator (542) which produces four streams of packets: the media packets (544), the row parity packets (546), the column parity packets (548), and the diagonal parity packets (550). In a SMPTE 2022 compliant receiver (552), the diagonal parity packets are ignored and the media packets, the row parity packets, and the column parity packets are fed into the FEC block (554). The FEC block recovers lost packets that are recoverable and outputs the media packets (560). In an advanced receiver that is also SMPTE 2022 compliant (556), the diagonal parity packets are ignored and the media packets, the row parity packets, and the column parity packets are fed into the FEC block (558). The FEC block recovers lost packets that are recoverable and outputs the media packets (562).

At the transmitter, all of the parity packets can be calculated and transmitted after all of the multi-media data packets in the block have been transmitted. Alternatively, the row parity packets can be interleaved with the multi-media data packets in such a way that each row parity packet is calculated and transmitted at the end of its respective row of multi-media data packets. The parity packets can be transmitted as separate stream from the multi-media data packets. The latter implementation allows the receiver to overlap the recovery of missing multi-media data packets in a row and the reception of data packets in subsequent rows. If a row has a single missing packet, that packet can be recovered after the last packet of the row is received. If a row is missing two or more packets, then the algorithm must wait until their respective columns are completely received.

At the receiver, jitter is due to the variability in the communication of packets and the processing required for the variable number of missing packets. To ameliorate jitter, every video frame can be delayed the maximum amount of time to recover missing packets and by overlapping the recovery of missing packets for a frame with the decompression of packets for the preceding frame.

If the compression rate differs from frame to frame, the size of the block of multi-media data packets can be changed from frame to frame. The header or payload can be used by the transmitter to inform the receiver how many and which multi-media data packets the transmitter has used to generate the parity packets.

As shown in FIG. 20, an implementation of the forward error correction method can selectively choose to use rows, columns and diagonals (as in the present invention) or only rows and columns as for the standards defined in (J. Rosenberg and H. Schulzrinne, IETF RFC 2733, An RTP payload format for generic forward error correction, Internet draft, February 1999, http://info.internet.isi.edu:80/in-drafts/files/draft-ietf-avt-fec-05.txt) and (Society of Motion Picture and Television Engineers, SMPTE 2002-2-2007, Forward Error Correction for Real-Time Video/Audio Transport Over IP Networks, http://store.smpte.org/product-p/smpte%202022-1-2007.htm). If rows, columns and diagonals are used, the redundancy is $(D+2 \times L+1)/D \times L$. If only rows and columns are used and the single parity packet is not used, the redundancy is $(D+L)/D \times L$; thus, the overhead is less and the ability to recover missing packets is correspondingly less.

What is claimed is:

1. A method for communication of multi-media data comprising the steps of:
   arranging multi-media data packets at a transmitter into a two-dimensional block A wherein
   block A has D horizontal rows and L vertical columns,
   one (1) is less than D is less than or equal to L,
   i and j are indices indicating rows and columns respectively of block A,
   A[i,j] indicates the entry at the ith row and jth column of the block,
   zero (0) is less than or equal to i is less than D,
   zero (0) is less than or equal to j is less than L,
   block A has a set of diagonals, each with a slant S,
   one (1) is less than or equal to S is less than L,
   each diagonal includes D entries in block A at A[i, (L−1−k−S×i) mod L] where zero (0) is less than or equal to i is less than D, and
   the set of diagonals consists of L diagonals;
   generating one or more of row parity packets wherein one packet is generated for each row of block A;
   generating one or more column parity packets wherein one packet is generated for each column of block A;
   generating one or more diagonal parity packets wherein one packet is generated for each diagonal in the set of diagonals;
   calculating each parity packet as an exclusive or (XOR) of the packets in the row, column or diagonal for which the parity packet is being calculated;
   communicating the data and related parity information from the transmitter to the receiver in a plurality of packets;
   the receiver arranging received data packets into a block having the same dimensions D×L as the block A used by the transmitter;
   the receiver identifying missing packets and corrupted packets;
   the receiver recovering missing packets and corrupted packets by processing the rows, columns and diagonals with a single missing data packet and iterating until no more missing packets can be recovered
   selecting the values of D, L and S to provide recovery of both individual random missing packets and bursts of consecutive missing packets;
   selecting the values of D and L such that the multi-media data to be communicated, such as a video or audio frame, can be accommodated in D×L packets;
   selecting the values of L and S such that the maximum anticipated length of a burst of missing packets is less than or equal to 2×L−S;
   selecting the values of D, L and S such that D×S and L are relatively prime, i.e., D×S and L have no common divisor other than 1; and,
   selecting the values of D, L and S such that, for all n, where one (1) is less than or equal to n is less than or equal to D−1, the value 2×n×S is not a multiple of L.

2. The method of claim 1, further comprising the steps of:
   the receiver maintaining a Missing Data Packets data structure that indicates the data packets in said block that it has not received and has not yet recovered;
   the receiver determining the number of missing data packets in each row, column and diagonal of said block;
   the receiver maintaining a Single Missing Data Packets data structure that records the index of each row, column and diagonal of said block that currently has exactly one missing data packet;
   the receiver using, for each row, column and diagonal recorded in said Single Missing Data Packets data structure, the parity packet for that row, column or diagonal to recover said missing data packet; and,
   the receiver inserting the recovered data packet into the block of data packets.

3. The method of claim 2, further comprising the steps of:
   as it receives a data packet or recovers a missing data packet that it has not received and inserts said data packet into said block, the receiver determining the number of missing data packets in the row, column and diagonal that contain said data packet;
   if the number of missing data packets in said row, column or diagonal now equals one, the receiver inserting the index of said row, column or diagonal with exactly one missing packet into said Single Missing Data Packets data structure; and,
   thereafter, the receiver using the parity packet for said row, column or diagonal inserted into said Single Missing Data Packets data structure to recover said missing data packet and inserting the recovered data packet into said block.

4. The method of claim 3, further comprising the steps of:
   when the receiver has received a data packet or recovered a data packet that it did not receive and has inserted said packet into said block, the receiver determining the number of missing data packets in each row, column and diagonal;

the receiver selecting a row, column or diagonal that has exactly one missing data packet;

the receiver using the parity packet for that row, column or diagonal to recover said missing data packet; and, the receiver inserting said recovered data packet into said block of data packets.

5. The method of claim 3, further comprising the steps of:
when the receiver has received a data packet or recovered a data packet that it did not receive and has inserted said packet into said block of data packets, the receiver determining the number of missing data packets in said row, column and diagonal that contain said recovered data packet; and, if the number of missing data packets in said row, column or diagonal now equals one, the receiver inserting the index of said row, column or diagonal with one missing data packet into said Single Missing Data Packets data structure.

6. The method of claim 3, further comprising the steps of:
the receiver maintaining a Number of Missing Data Packets data structure that records the number of data packets in each row that are currently missing, the number of data packets in each column that are currently missing and the number of data packets in each diagonal that are currently missing;

the receiver initially counting all data packets as missing and the Number of Missing Data Packets data structure indicating the total number of data packets for each row, column and diagonal that are to be received;

when the receiver receives a data packet or recovers a corrupted or lost data packet and inserts said data packet into the block, the receiver decrementing the numbers recorded in said Number of Missing Data Packets data structure for the row, column and diagonal that contain said recovered data packet; and, if any of the decremented numbers now equals one, the receiver inserting the index of said row, column or diagonal into said Single Missing Data Packets data structure.

7. The method of claim 1, further comprising the steps of:
selecting a calculation method that when used to calculate a single parity packet from each of plural row parity packets, plural column parity packets and plural diagonal parity packets results in three parity packets, each having the same value; and, using any one of the three parity packets to recover a missing parity packet in the set of row parity packets, the set of column parity packets and the set of diagonal parity packets.

8. The method of claim 7, further comprising the steps of:
calculating the single parity packet for all three sets of parity packets at the transmitter;

transmitting the single parity packet for receipt by the receiver;

if the receiver does not receive the single parity packet and the receiver has received all of the parity packets in the set of row parity packets, the receiver using said set of row parity packets to calculate the single parity packet; and, if the receiver does not receive the single parity packet and the receiver has received all of the parity packets in the set of column parity packets, the receiver using the set of column parity packets to calculate the single parity packet; and, if the receiver does not receive the single parity packet and the receiver has received all of the parity packets in the set of diagonal parity packets, the receiver using the set of diagonal parity packets to calculate the single parity packet and the receiver using the single parity packet to recover one or more of one missing parity packet in a) the set of row parity packets, b) the set of column parity packets and c) the set of diagonal parity packets.

9. The method of claim 7, further comprising the steps of:
if all of the row parity packets are received at the receiver, the receiver calculating the single parity packet for all three sets of parity packets from the set of row parity packets and using the parity packet to recover any of one missing parity packet in the set of column parity packets, one missing parity packet in the set of diagonal parity packets;

if all of the column parity packets are received at the receiver, the receiver calculating the single parity packet for all three sets of parity packets from the set of column parity packets and using the parity packet to recover any of one missing parity packet in the set of row parity packets, one missing parity packet in the set of diagonal parity packets; and, if all of the diagonal parity packets are received at the receiver, the receiver calculating the single parity packet for all three sets of parity packets from the set of diagonal parity packets using the parity packet to recover any of one missing parity packet in the set of row parity packets and one missing parity packet in the set of column parity packets.

10. The method of claim 7, further comprising the steps of:
the receiver maintaining a Missing Parity Packets data structure that indicates the parity packets that it has not received and has not yet recovered;

the receiver determining the number of missing row parity packets, column parity packets and diagonal parity packets; and, if there is a single missing row parity packet or a single missing column parity packet or a missing diagonal parity packet, the receiver using the extra single parity packet to recover said single missing parity packet and inserting the recovered parity packet into said set of row parity packets or column parity packets or diagonal parity packets.

11. The method of claim 10, further comprising the steps of:
the receiver maintaining a Number of Missing Parity Packets data structure that records the number of row parity packets that are currently missing, the number of column parity packets that are currently missing, the number of diagonal parity packets that are currently missing, and a number that indicates whether the extra single parity packet is currently missing;

initially counting all parity packets as missing; the Number of Missing Parity Packets data structure indicating the total numbers of row parity packets, column parity packets, diagonal parity packet and extra single parity packet that are to be received; and, the receiver decrementing the number recorded in said Number of Missing Party Packets data structure when the receiver has received or recovered a parity packet that was lost or corrupted and has inserted said parity packet into said set of parity packets.

* * * * *

UNITED STATES PATENT AND TRADEMARK OFFICE
CERTIFICATE OF CORRECTION

| | | |
|---|---|---|
| PATENT NO. | : 8,230,316 B2 | Page 1 of 1 |
| APPLICATION NO. | : 12/358181 | |
| DATED | : July 24, 2012 | |
| INVENTOR(S) | : Peter Michael Melliar-Smith, Louise Elizabeth Moser and Chin Chye Koh | |

It is certified that error appears in the above-identified patent and that said Letters Patent is hereby corrected as shown below:

Column 19, line 55 (claim 1), "block A has a set of diagonals, each with a slant S," should read
--block A has a set of diagonals, indexed by k, each with a slant S,--

Signed and Sealed this
Eighteenth Day of September, 2012

David J. Kappos
*Director of the United States Patent and Trademark Office*